United States Patent
Miyai et al.

(10) Patent No.: US 6,797,563 B2
(45) Date of Patent: Sep. 28, 2004

(54) METHOD OF FORMING CROSS POINT TYPE DRAM CELL

(75) Inventors: Yoichi Miyai, Kodaira (JP); Hiroyuki Yoshida, Ibaraki-Ken (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/348,239

(22) Filed: Jan. 21, 2003

(65) Prior Publication Data

US 2003/0132456 A1 Jul. 17, 2003

Related U.S. Application Data

(62) Division of application No. 09/392,133, filed on Sep. 8, 1999, now Pat. No. 6,563,155.
(60) Provisional application No. 60/099,508, filed on Sep. 8, 1998.

(51) Int. Cl.[7] .............................................. H01L 21/336
(52) U.S. Cl. ....................................... 438/257; 438/593
(58) Field of Search ................................ 438/248–257, 438/253–256, 239–241, 593

(56) References Cited

U.S. PATENT DOCUMENTS

| | | |
|---|---|---|
| 5,166,762 A | 11/1992 | Yoshida |
| 5,350,708 A | 9/1994 | Yagishita et al. |
| 5,552,620 A | 9/1996 | Lu et al. |
| 5,561,308 A | 10/1996 | Kamata et al. |
| 5,627,390 A | 5/1997 | Maeda et al. |
| 5,629,539 A | 5/1997 | Aoki et al. |
| 5,828,094 A | 10/1998 | Lee |
| 6,563,155 B2 * | 5/2003 | Miyai et al. .................. 257/296 |

FOREIGN PATENT DOCUMENTS

| | | |
|---|---|---|
| JP | 03 046760 | 2/1988 |
| JP | 01 149454 | 12/1989 |
| JP | 02 014563 | 1/1990 |
| JP | 04 234166 | 8/1992 |

* cited by examiner

Primary Examiner—Dung A. Le
(74) Attorney, Agent, or Firm—Wade James Brady, III; Frederick J. Telecky, Jr.

(57) ABSTRACT

A dynamic random access memory (DRAM) device comprises a substrate, a plurality of substantially parallel word lines, and a plurality of substantially parallel bit lines. A plurality of memory cells are formed at intersections of the word lines and bit lines. Each of the memory cells includes a pillar of semiconductor material which extends outward from the substrate. A storage node plug extends from a storage node through the pillar to a storage node contact and one of a drain and a source of a MOS transistor. A bit line plug extends from the bit line inwardly to the outer surface of the pillar to form a bit line contact and the other of the drain and the source of the MOS transistor. A word line plug extends from the word line through the pillar and a portion of the word line plug forms a gate of the MOS transistor. The storage node plug, bit line plug, and word line plug can be formed asymmetrically as substantially solid, unitary structures having a desired thickness for ease in manufacturing. A method for manufacturing such a device is also disclosed, and requires only four masks.

19 Claims, 25 Drawing Sheets

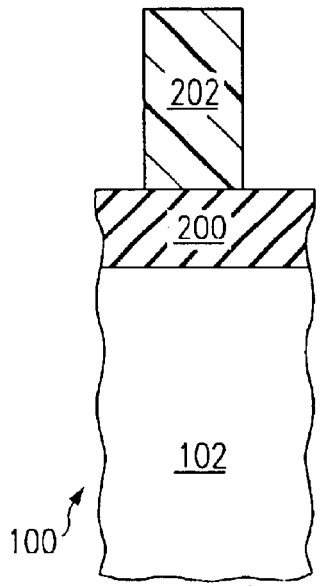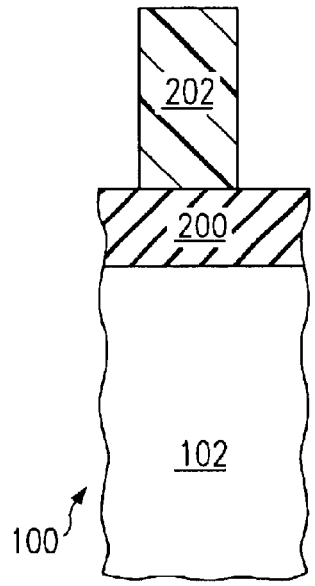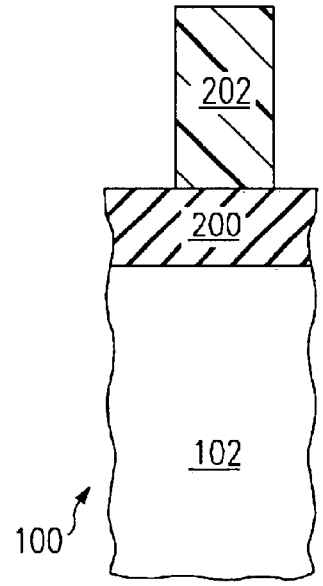
FIG. 9A          FIG. 9B          FIG. 9C
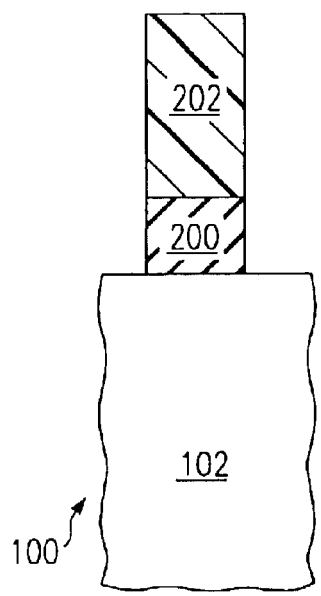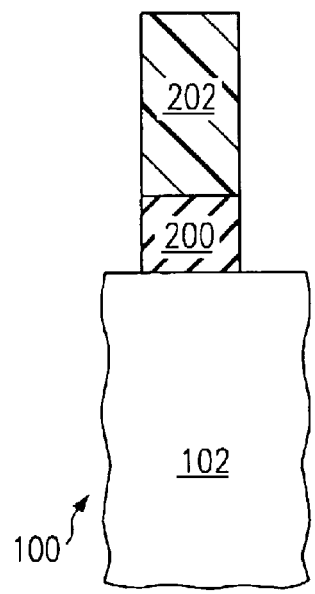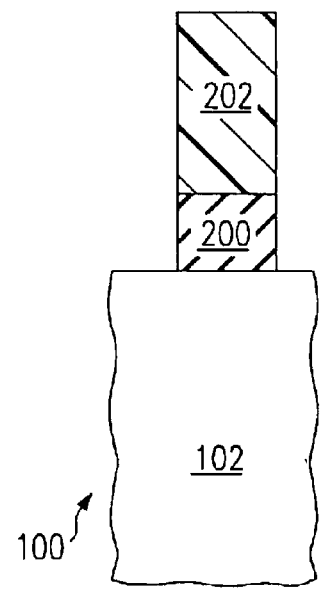
FIG. 10A         FIG. 10B         FIG. 10C

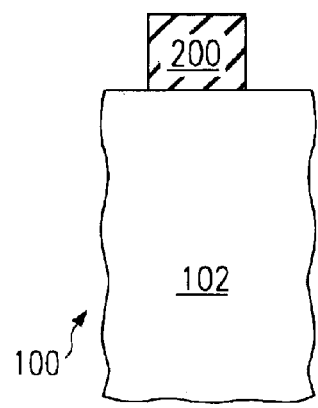
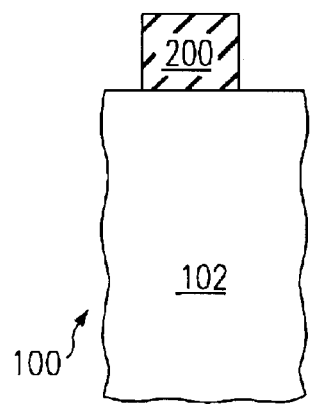
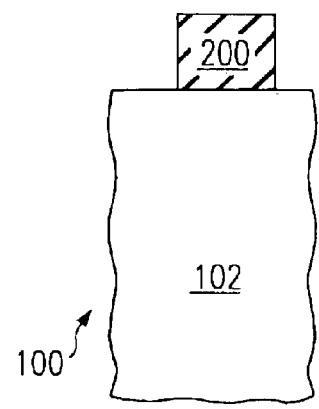
FIG. 11A  FIG. 11B  FIG. 11C
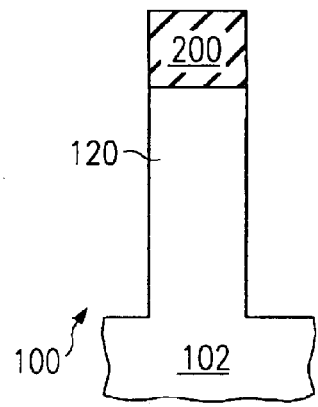
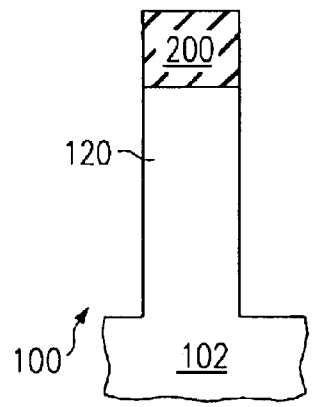
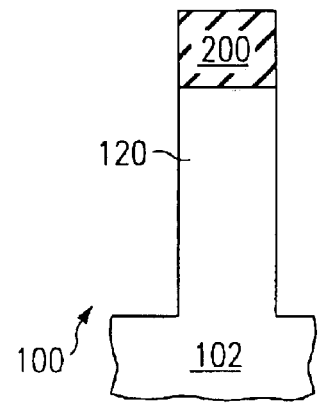
FIG. 12A  FIG. 12B  FIG. 12C
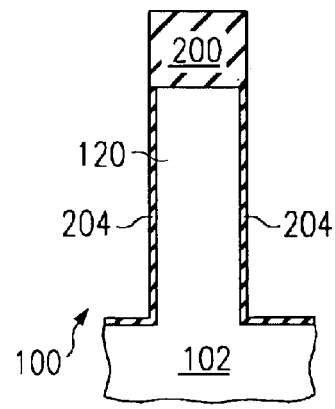
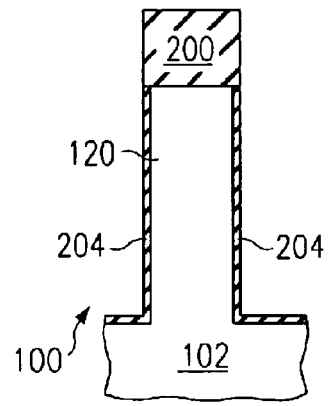
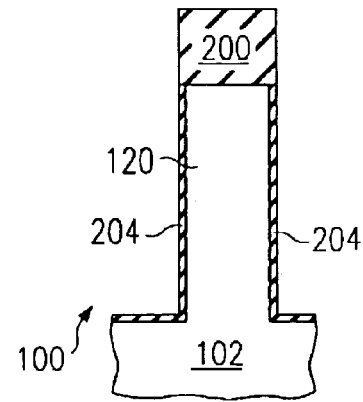
FIG. 13A  FIG. 13B  FIG. 13C

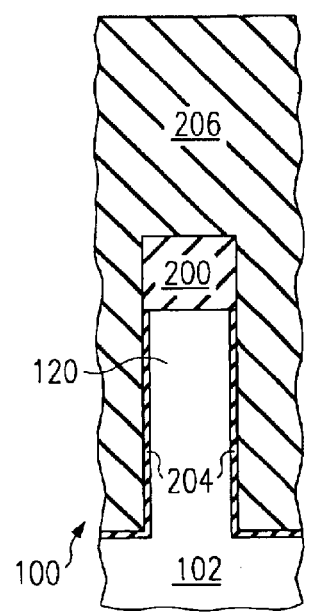
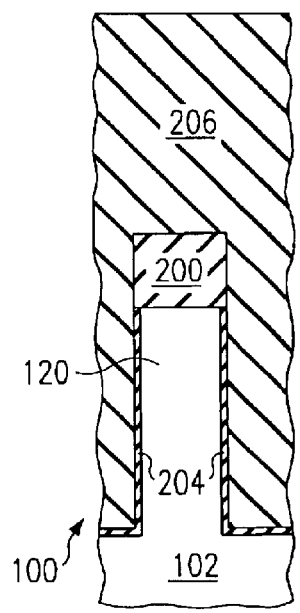
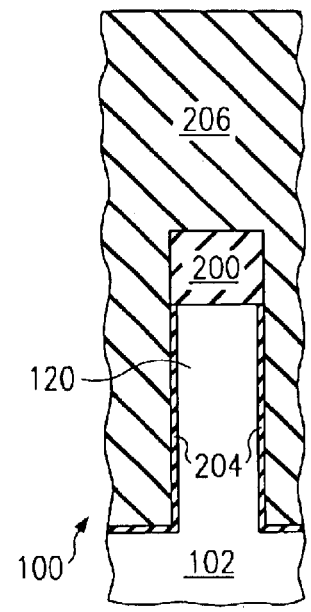
FIG. 14A        FIG. 14B        FIG. 14C
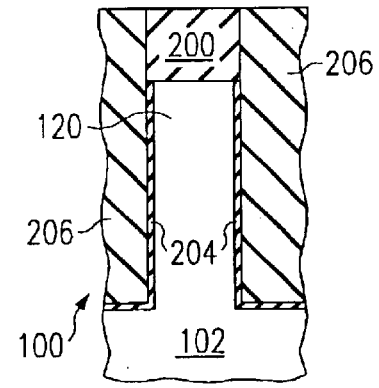
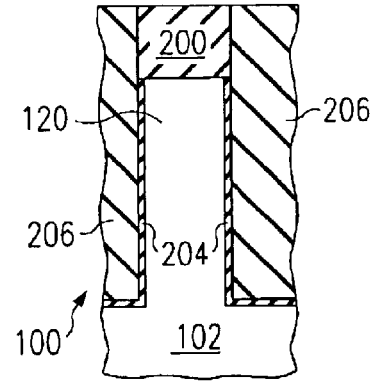
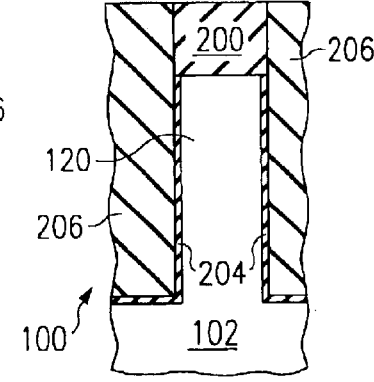
FIG. 15A        FIG. 15B        FIG. 15C
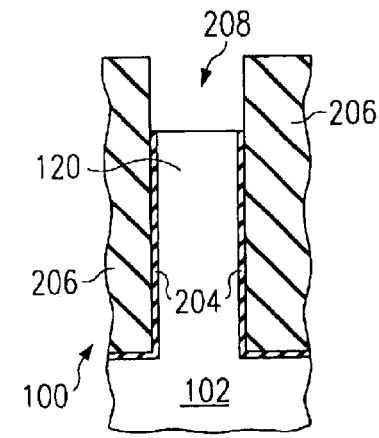
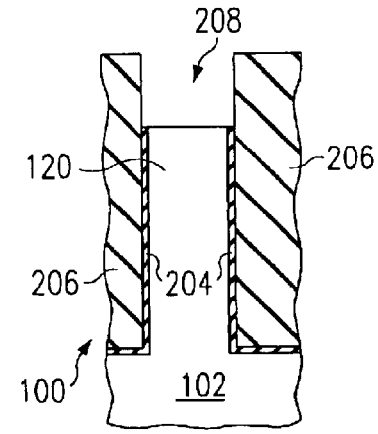
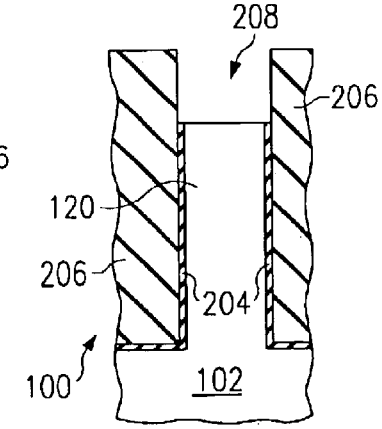
FIG. 16A        FIG. 16B        FIG. 16C

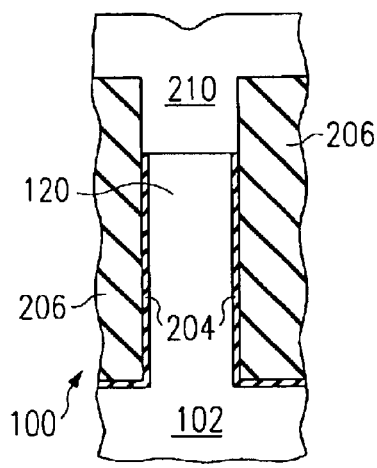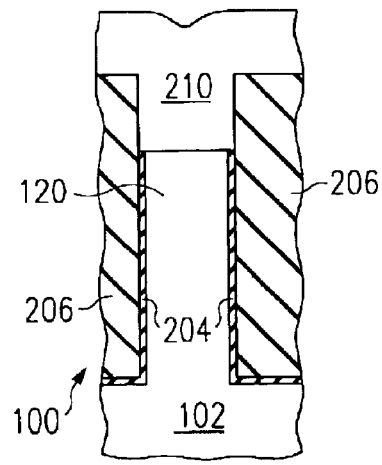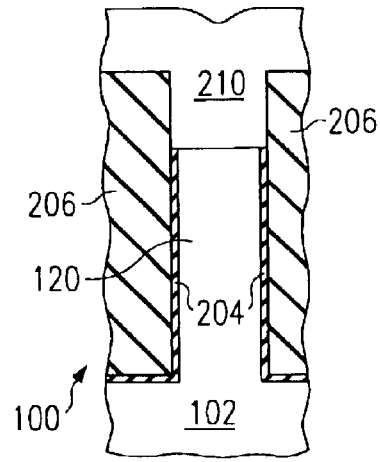
FIG. 17A  FIG. 17B  FIG. 17C
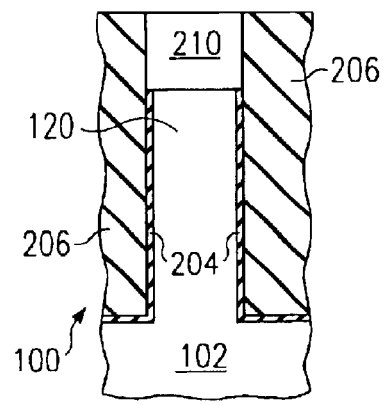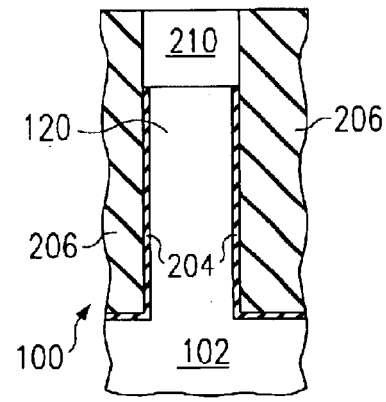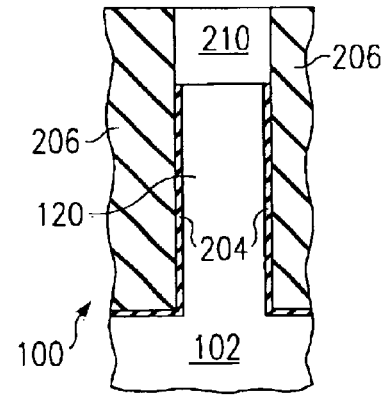
FIG. 18A  FIG. 18B  FIG. 18C
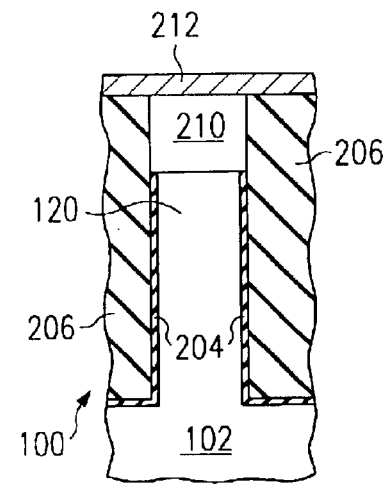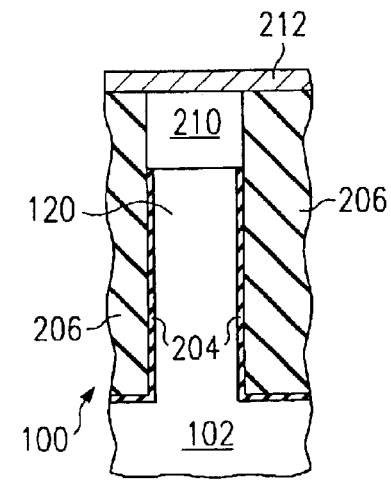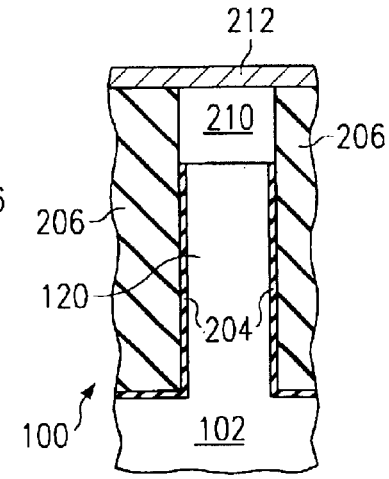
FIG. 19A  FIG. 19B  FIG. 19C

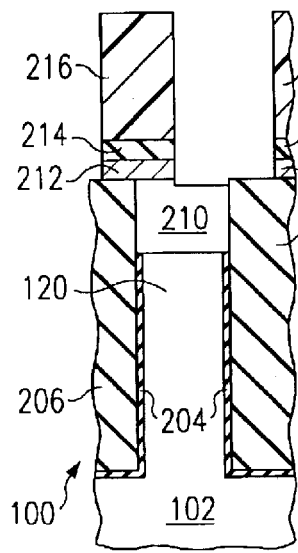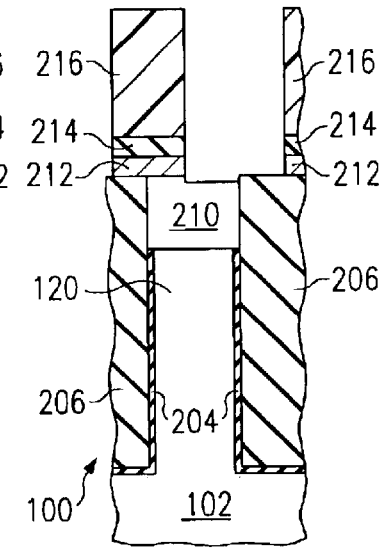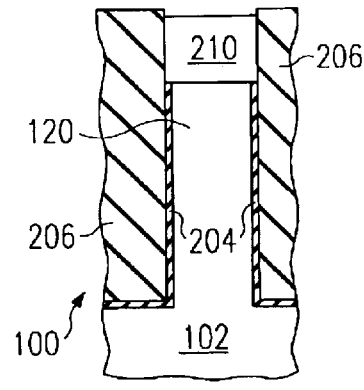
FIG. 24A    FIG. 24B    FIG. 24C
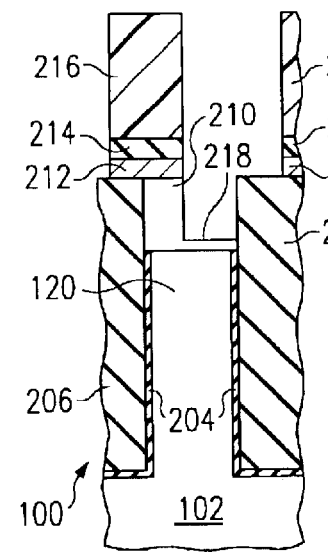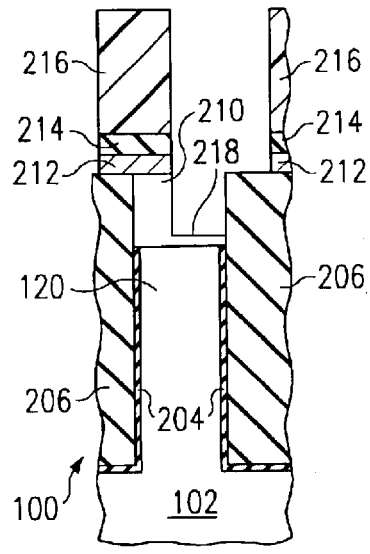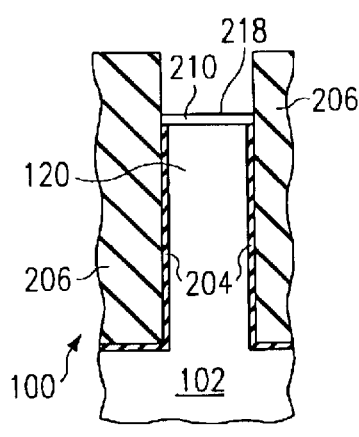
FIG. 25A    FIG. 25B    FIG. 25C

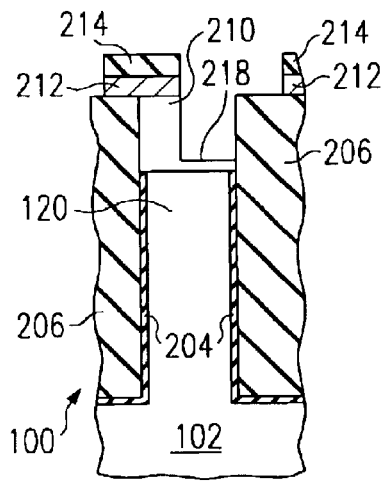
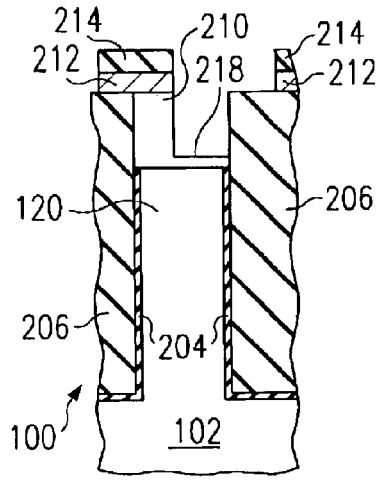
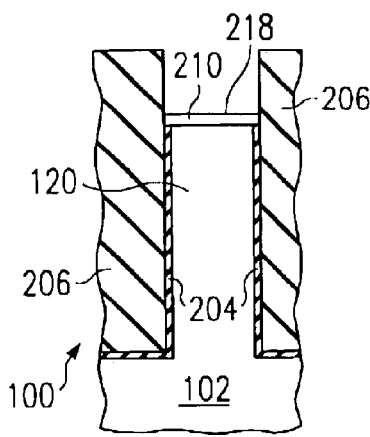
FIG. 26A  FIG. 26B  FIG. 26C
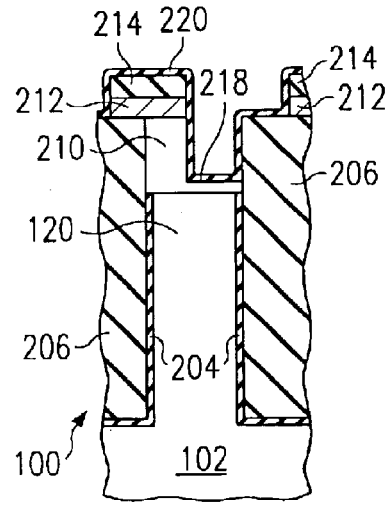
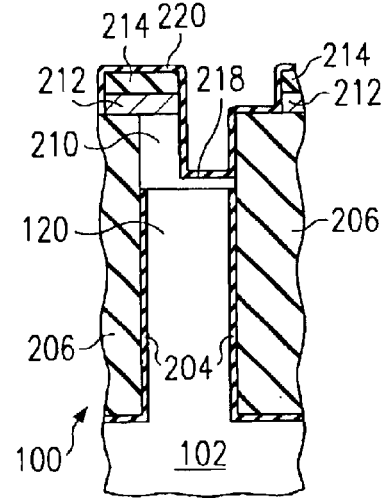
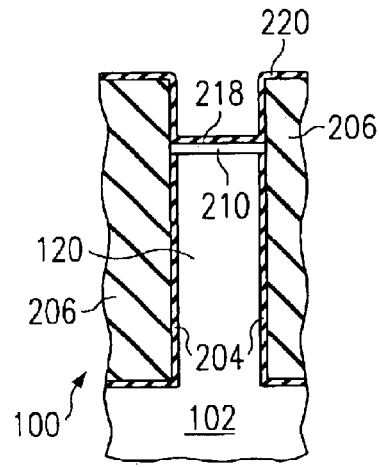
FIG. 27A  FIG. 27B  FIG. 27C
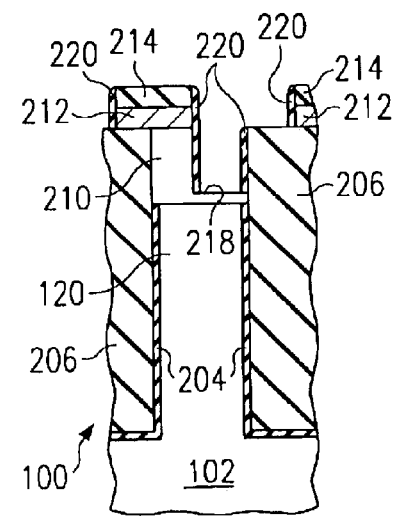
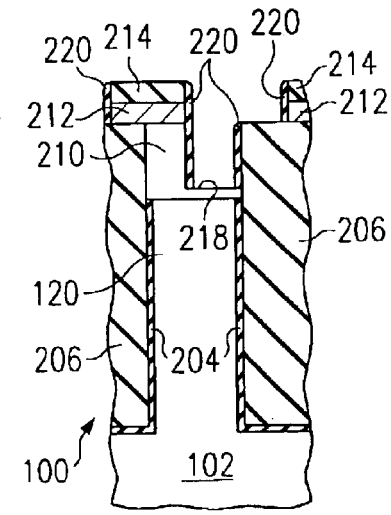
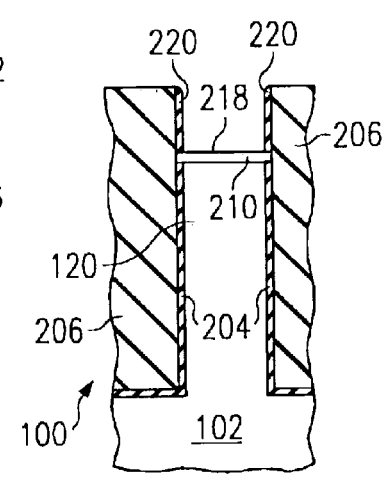
FIG. 28A  FIG. 28B  FIG. 28C

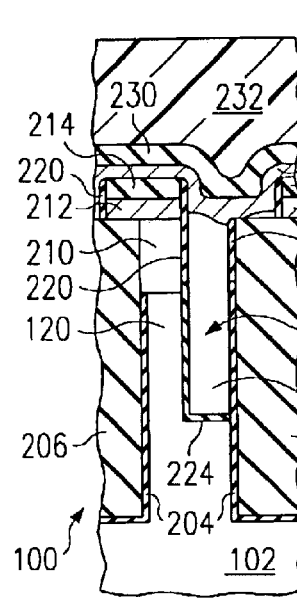
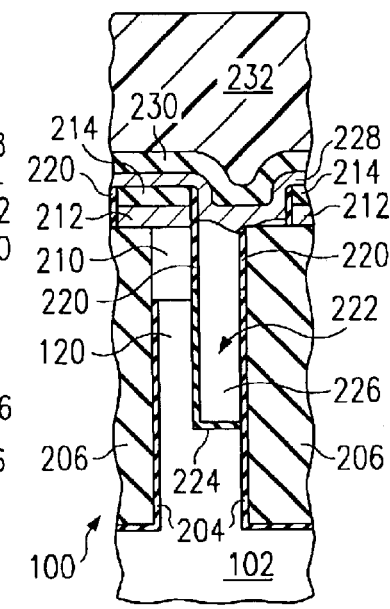
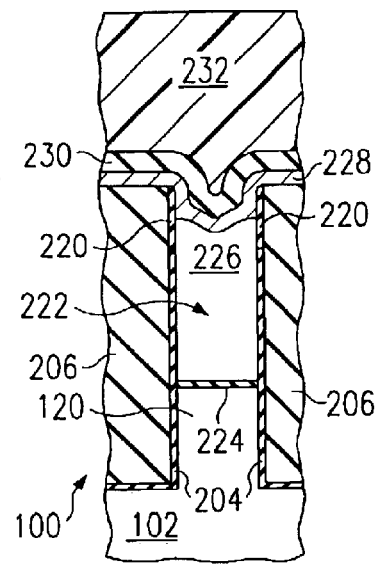
FIG. 35A  FIG. 35B  FIG. 35C
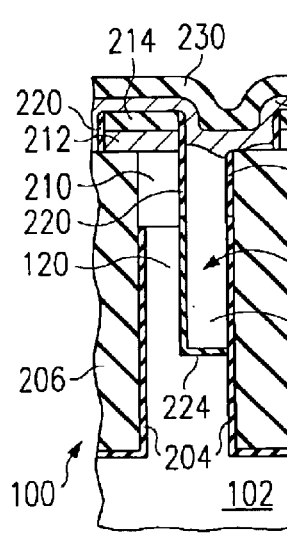
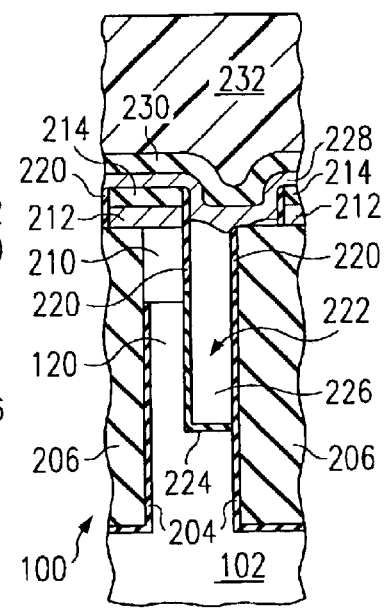
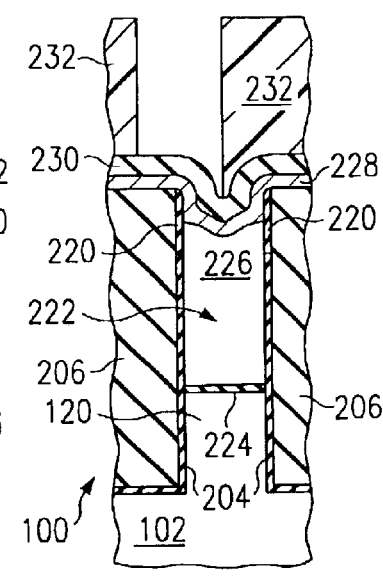
FIG. 36A  FIG. 36B  FIG. 36C

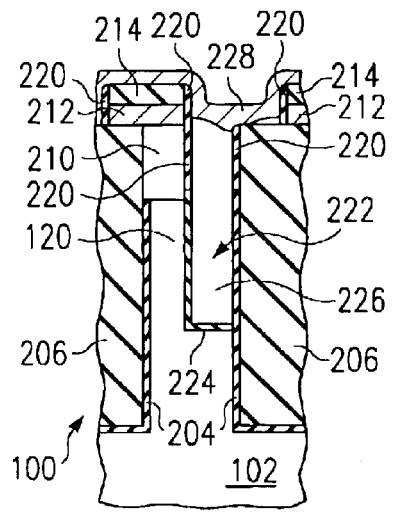 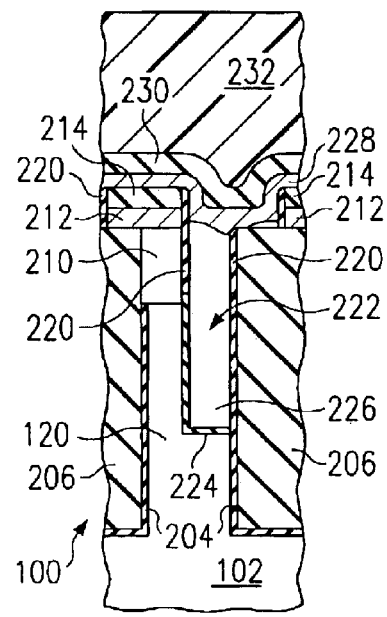 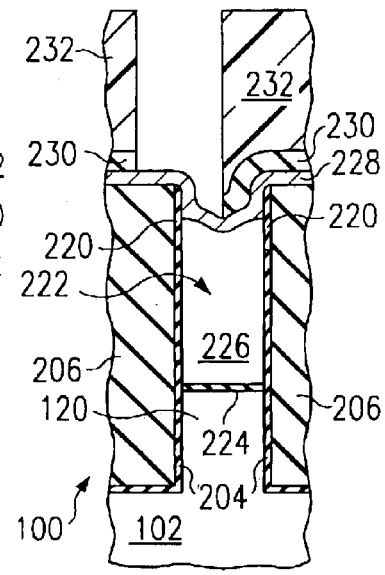
FIG. 37A  FIG. 37B  FIG. 37C
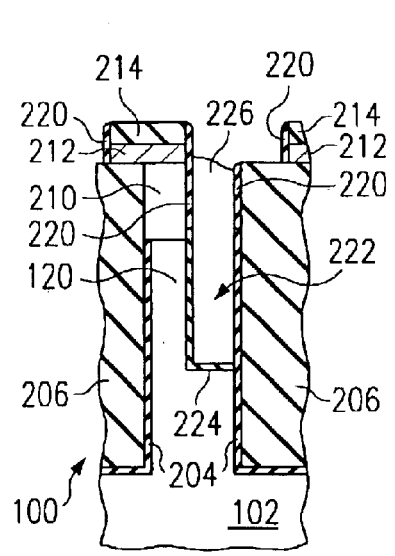 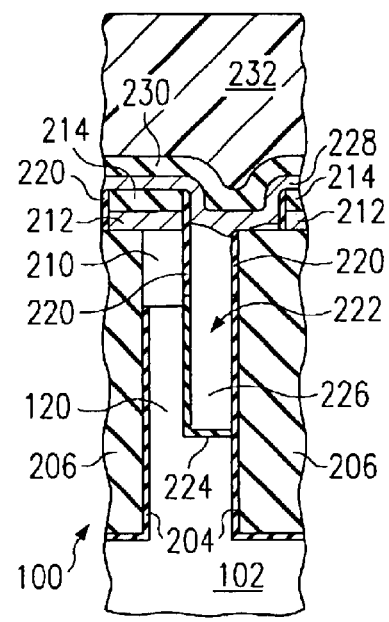 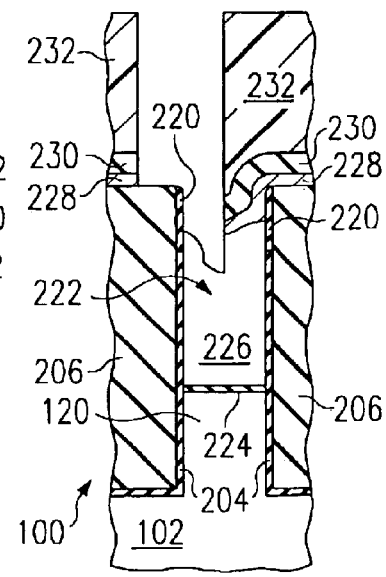
FIG. 38A  FIG. 38B  FIG. 38C

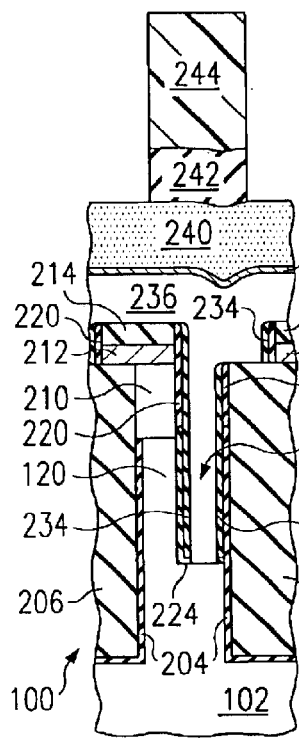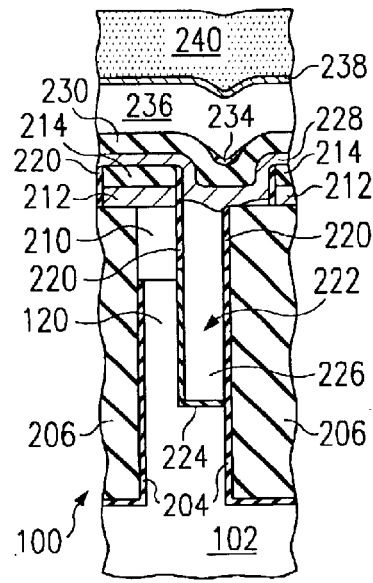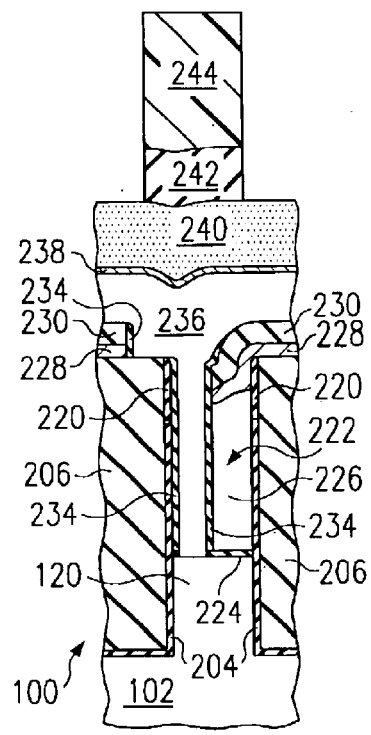
FIG. 50A  FIG. 50B  FIG. 50C
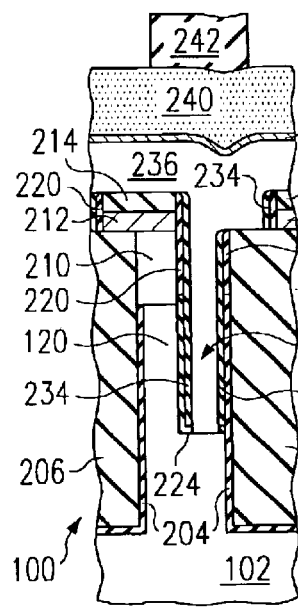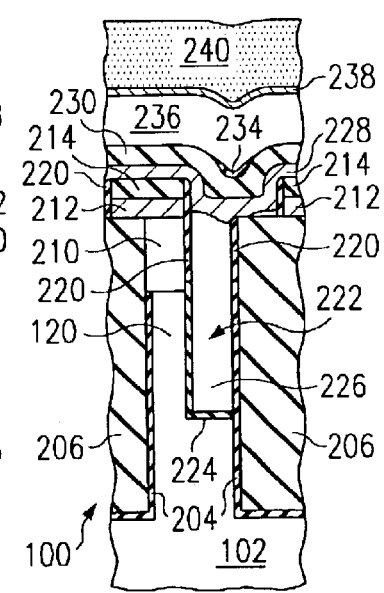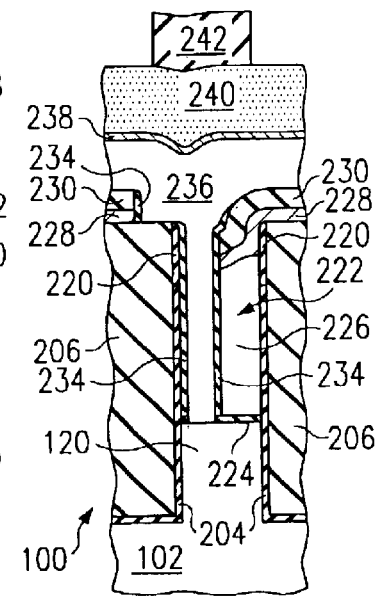
FIG. 51A  FIG. 51B  FIG. 51C

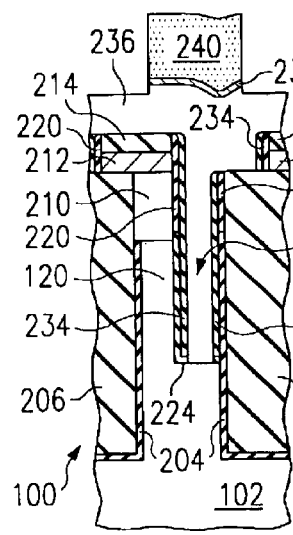 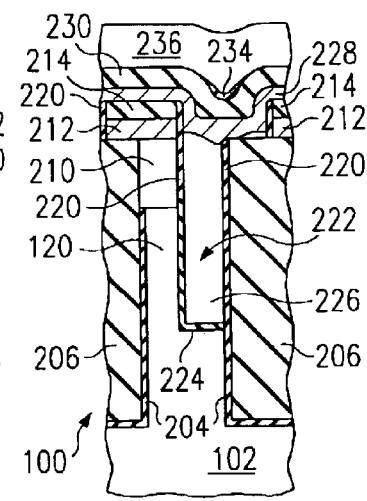 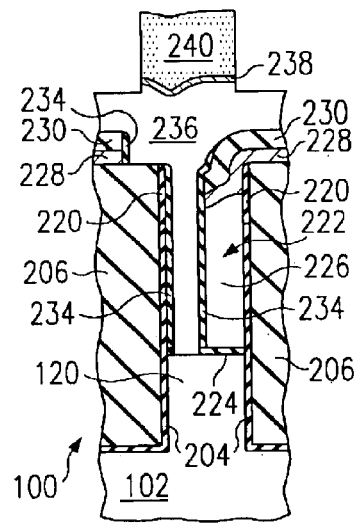
FIG. 52A    FIG. 52B    FIG. 52C
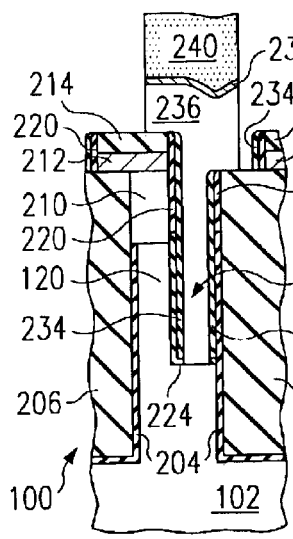 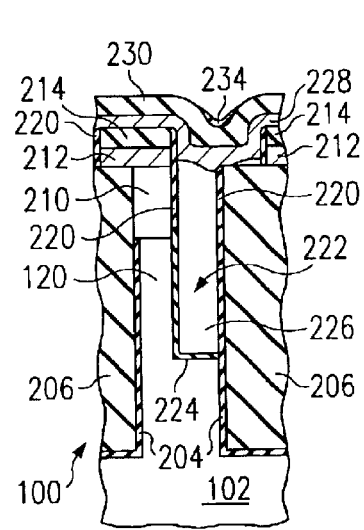 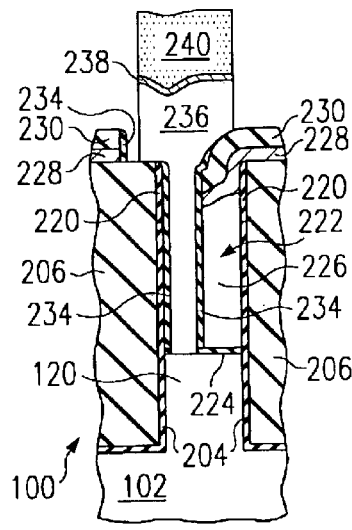
FIG. 53A    FIG. 53B    FIG. 53C

METHOD OF FORMING CROSS POINT TYPE DRAM CELL

This is a divisional application of Ser. No. 09/392,133 filed Sep. 8, 1999, now U.S. Pat. No. 6,563,155 which is a non-provisional application claiming priority from provisional application Serial No. 60/099,508 filed Sep. 8, 1998.

TECHNICAL FIELD OF THE INVENTION

This invention relates generally to dynamic random access memory (DRAM) cell devices and particularly relates to a realistic formation method for such devices which does not require poor step coverage of the thin films employed.

BACKGROUND OF THE INVENTION

Continued growth in the capacity of dynamic random access memory (DRAM) technology can be enhanced by minimizing the size of individual DRAM cells. As technology develops, DRAM devices need to store more bits of information, use less power per bit of stored information and have the individual memory cells containing the stored bits occupy less area on the semiconductor chip. The smallest theoretical limit of a memory cell is four times the square of the feature size on a chip, or $4F^2$ where F represents minimum feature size. The feature size is the minimum width of the electrical leads or wiring and minimum spacing between wiring on the chip. Each cell comprises a MOS pass transistor and a storage capacitor.

A memory cell which achieves this type of minimum size is known as a cross point cell. The name "cross point cell" is derived from the location of the cell in an array of cells at the point where one word line and one bit line cross each other. Such cells normally employ an open bit line architecture. The open bit line architecture can result in detrimental substrate noise coupling into the bit lines, and can require an excessive number of masks to form the cross point cell.

In an effort to address these problems, the invention described in U.S. patent application Ser. No. 08/934,157 was developed. The Ser. No. 08/934,157 application is expressly incorporated herein by reference, and is co-assigned to Texas Instruments Incorporated. Although the DRAM cell and manufacturing method disclosed in the referenced application are quite promising, the formation method in the referenced application depends on deliberately obtaining poor step coverage of certain materials during the fabrication process. In particular, poor step coverage was desired at the bottom of holes during fabrication of the structures. It is difficult to obtain consistent manufacturing quality when the method requires deliberately seeking poor step coverage.

Further, in the prior art exemplified in the Ser. No. 08/934,157 application, each functional part of the cross point DRAM cell is formed as a portion of a symmetrical pillar. Therefore, each element has a double layer, due to the symmetry of the cell about a center line. Accordingly, to minimize the cell dimensions, the thickness of each layer had to be quite thin, resulting in added manufacturing difficulties.

SUMMARY OF THE INVENTION

Therefore, a need has arisen for a realistic method of forming a cross point type DRAM cell which does not depend on poor step coverage of the thin films, and which can be formed in an asymmetric fashion so that each element of the cell need not be divided into two excessively thin layers. The present invention provides such a realistic formation method of the cross point type DRAM cell wherein the process does not depend on poor step coverage of the thin films. Further, each individual DRAM cell can be formed in an asymmetric fashion with more realistic thicknesses for the various components which are employed.

In accordance with the present invention, a dynamic random access memory (DRAM) device comprises a substrate of semiconductor material having a main outer surface; a plurality of substantially parallel word lines which are located outwardly of the main outer surface of the substrate; and a plurality of substantially parallel bit lines which are also located outwardly of the main outer surface of the substrate. Each of the word lines has a word line width defined by first and second word line edges and is separated from adjacent word lines by a word line separation distance. Similarly, each of the bit lines has a bit line width defined by first and second bit line edges and is separated from adjacent bit lines by a bit line separation distance. The bit lines are substantially perpendicular to the word lines.

The device further comprises a plurality of memory cells each associated with an intersection of a given one of the fist and second world line edges of a given one of the word lines and a given one of the first and second bit line edges of a given one of the bit lines. Each of the memory cells in turn comprises a pillar of semiconductor material; a storage node; a storage node plug; a bit line plug; and a word line plug. The pillar of semiconductor material extends outward from the main outer surface of the substrate and is electrically isolated from adjacent memory cells. The pillar has a pillar outer surface and includes an active region of the semiconductor material which is substantially centered inward of the intersection. The pillar is formed with a hole region which is defined by a hole floor and at least one hole wall. The hole floor is located outwardly of the main outer surface of the substrate.

The storage node is offset from the active region of the pillar in a direction away from the given one of the word lines and the given one of the bit lines. The storage node plug extends from the storage node, through the hole region in the pillar, to contact the hole floor and to form thereat a storage node contact and one of a drain and a source of a MOS transistor. The storage node plug is electrically isolated from the at least one hole wall.

The bit line plug extends from the given one of the bit lines inwardly to contact the pillar outer surface and to form thereat a bit line contact and the other of the drain and the source of the MOS transistor. The word line plug extends from the given one of the word lines through the hole region in the pillar and terminates outwardly of the hole floor. The word line plug is electrically isolated from the semiconductor material of the pillar, such that a portion of the word line plug adjacent to and electrically isolated from the semiconductor material of the pillar forms a gate of the MOS transistor. A corresponding portion of the semiconductor material of the pillar forms a channel region of the MOS transistor.

In accordance with the present invention, a method for manufacturing a dynamic random-access memory device comprises the steps of providing a substrate of semiconductor material; forming a plurality of pillars of semiconductor material extending outward from the substrate; forming a plurality of substantially parallel bit lines; interconnecting the bit lines with outer surfaces of the pillars via a plurality of bit line plugs; forming at least one hole region in each of the plurality of pillars; forming a plurality of substantially parallel word lines; locating a word line plug in each of the hole regions; forming a plurality of storage nodes; and interconnecting the storage nodes with the floors of the hole regions in the pillars via a plurality of storage node plugs. The substrate of semiconductor material which is provided can have a main outer surface. The pillars can extend outwardly from the main outer surface of the substrate, and each of the pillars can have a pillar outer surface. The pillars can be formed using a first mask, and can be electrically isolated from each other. The pillars can include an active region of the semiconductor material.

In the step of forming the plurality of substantially parallel bit lines, the bit lines can be located outwardly of the main outer surface of the substrate, and each of the bit lines can have a bit line width defined by first and second bit line edges. Further, each of the bit lines can be separated from adjacent bit lines by a bit line separation distance. The bit lines can be formed using a second mask.

In the step of interconnecting the bit lines with the pillar outer surfaces via the bit line plugs, the result can be the formation of a plurality of bit line contacts and one of drains and sources of a plurality of MOS transistors at the intersections of the bit line plugs with the pillar outer surfaces. In the step of forming the at least one hole region, the region can be defined by a hole floor and at least one hole wall. Such a hole region can be formed in each of the plurality of pillars, and the hole floors can be located outwardly of the main outer surface of the substrate.

In the step of forming the plurality of substantially parallel word lines, the word lines can be located outwardly of the main outer surface of the substrate, and each of the word lines can have a word line width defined by first and second word line edges. Further, each of the word lines can be separated from adjacent word lines by a word line separation distance. The word lines can be substantially perpendicular to the bit lines, and the word lines can be formed using a third mask. A given one of the first and second word line edges of a given one of the word lines and a given one of the first and second bit line edges of a given one of the bit lines can intersect substantially outward of the center of a given one of the active regions.

In the step of locating the word line plug in each of the hole regions, each of the word line plugs can extend from a corresponding adjacent one of the word lines inwardly into the hole region and can terminate outward of the hole floor. Each of the word line plugs can be electrically isolated from the semiconductor-material of the pillar, such that a portion of each of the word line plugs adjacent to and electrically isolated from the semiconductor material of the pillar forms a gate of the MOS transistor, with the corresponding portion of the semiconductor material of the pillar forming a channel region of the MOS transistor.

In the step of forming the plurality of storage nodes, one node can be formed for each of the active regions, and each of the storage nodes can be offset from the corresponding one of the active regions in a direction away from the given one of the word lines and the given one of the bit lines which intersect substantially outwardly of the center of the given one of the active regions. The storage nodes can be formed using a fourth mask.

Finally, in the step of interconnecting the storage nodes with the hole floors of the pillars via the plurality of storage node plugs, the interconnection can be conducted such as to form a plurality of storage node contacts and the other of sources and drains of the plurality of MOS transistors at the intersections of the storage node plugs with the hole floors. The storage node plugs can extend through the hole regions in the pillars and can be electrically isolated from the hole walls and the word line plugs.

Technical advantages of the present invention include a formation process which can be carried out with existing process technologies, and which does not depend on deliberate poor step coverage of the thin films. Further, the formation process is enhanced since the symmetrical structure of the prior art cell, with concomitant excessively thin layers, is done away with. However, significant technical advantages of the prior-art Ser. No. 08/934,157 application are retained, including minimization of transmission of substrate noise to the bit line and a reduced number of masks (four) required for fabrication.

Other technical advantages of the present invention will be readily apparent to one skilled in the art from the following figures, descriptions, and claims.

BRIEF DESCRIPTIONS OF THE DRAWINGS

For a more complete understanding of the present invention and the advantages thereof, reference is now to be made to the following description taken in conjunction with the accompanying drawings in which like reference numbers indicate like features and wherein:

FIGS. 6A, 6B and 6C through 56A, 56B and 56C depict representative manufacturing steps viewed along lines A—A, B—B, and C—C in FIG. 3 respectively, for a representative DRAM cell manufactured in accordance with the present invention.

DETAILED DESCRIPTION OF THE INVENTION

The dynamic random access memory (DRAM) device of the present invention will now be described with reference to FIGS. 1 and 3–5. The DRAM device, designated generally as 100, includes a substrate 102 of semiconductor material, such as silicon, having a main outer surface 104. Also included are a plurality of substantially parallel word lines 106 which are located outwardly of the main outer surface 104 of the substrate 102. Each of the word lines 106 has a word line width, $W_{WL}$, defined by first and second word line edges 108, 110. Each word line is separated from adjacent word lines by a word line separation distance $D_{WS}$.

The DRAM device also includes a plurality of substantially parallel bit lines 112 which are located outwardly of the main outer surface 104 of the substrate 102. Each of the bit lines 112 has a bit line width, $W_{BL}$, which is defined by first and second bit line edges 114, 116. Each of the bit lines 112 is separated from adjacent bit lines by a bit line separation distance $D_{BS}$. The bit lines 112 are substantially perpendicular to the word lines 106.

Figure 1:
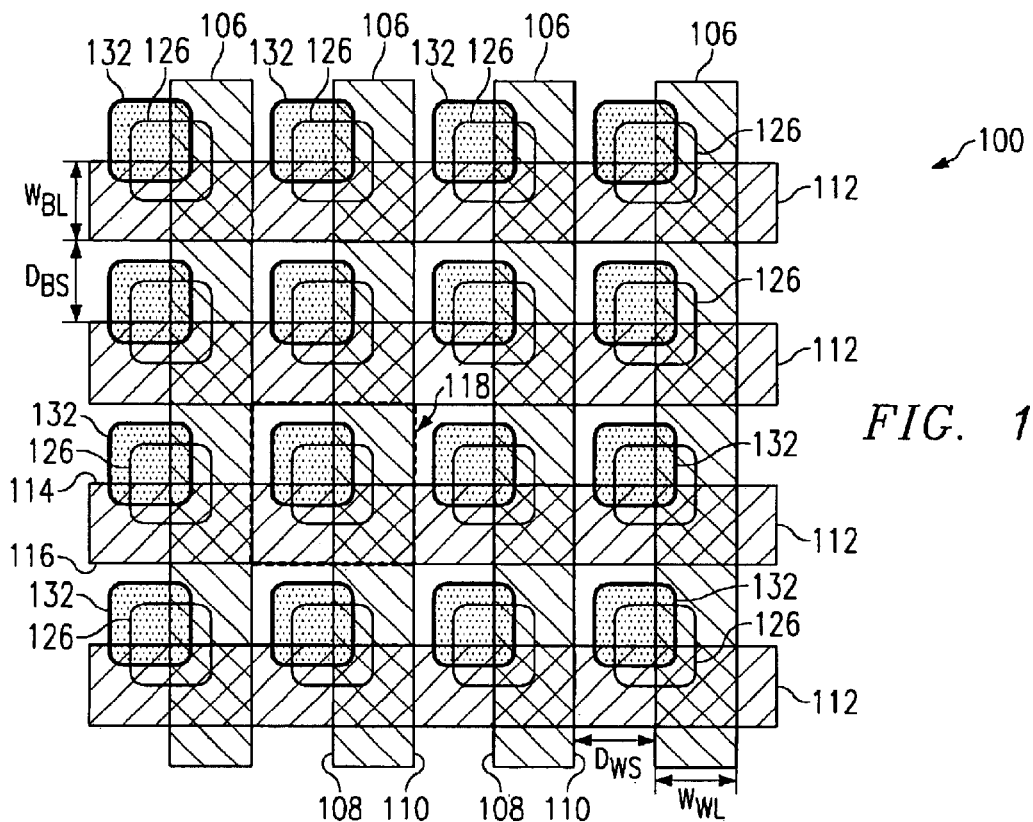
FIG. 1 is a plan view of a first embodiment of a DRAM structure according to the present invention.
Figure 5:
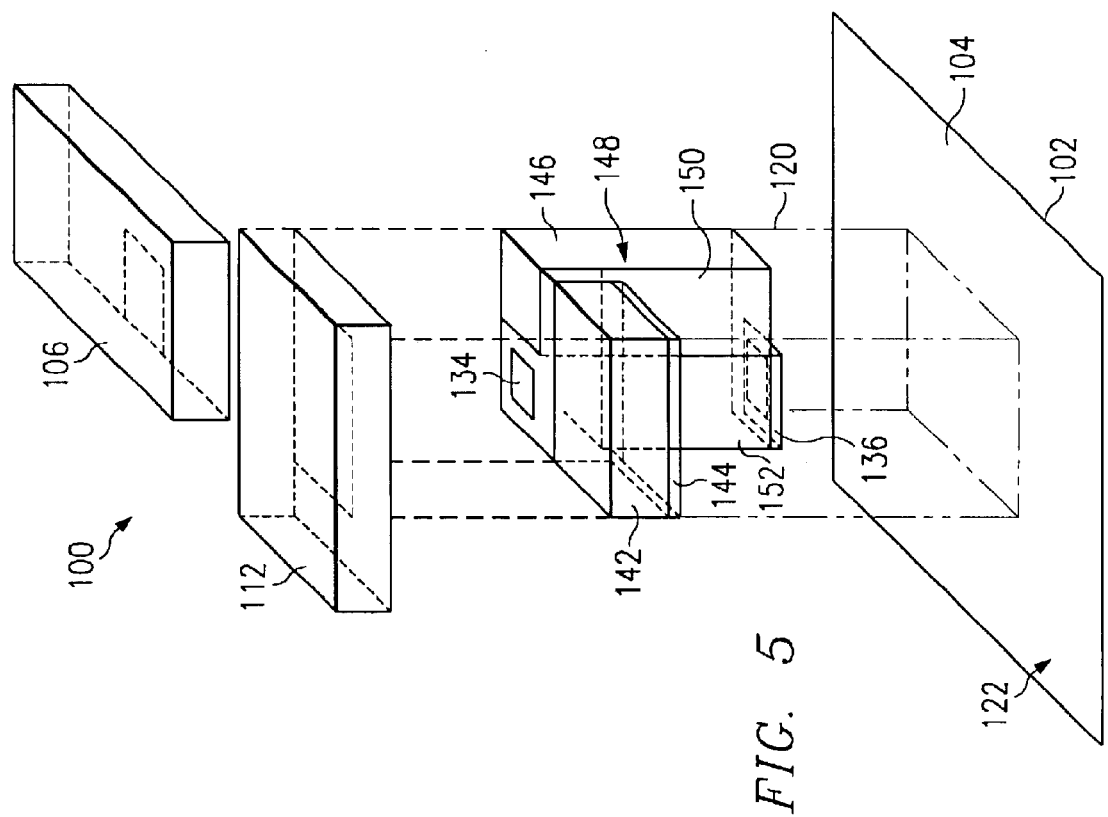
FIG. 5 is an exploded perspective view of a DRAM cell in accordance with the present invention.
Figure 3:
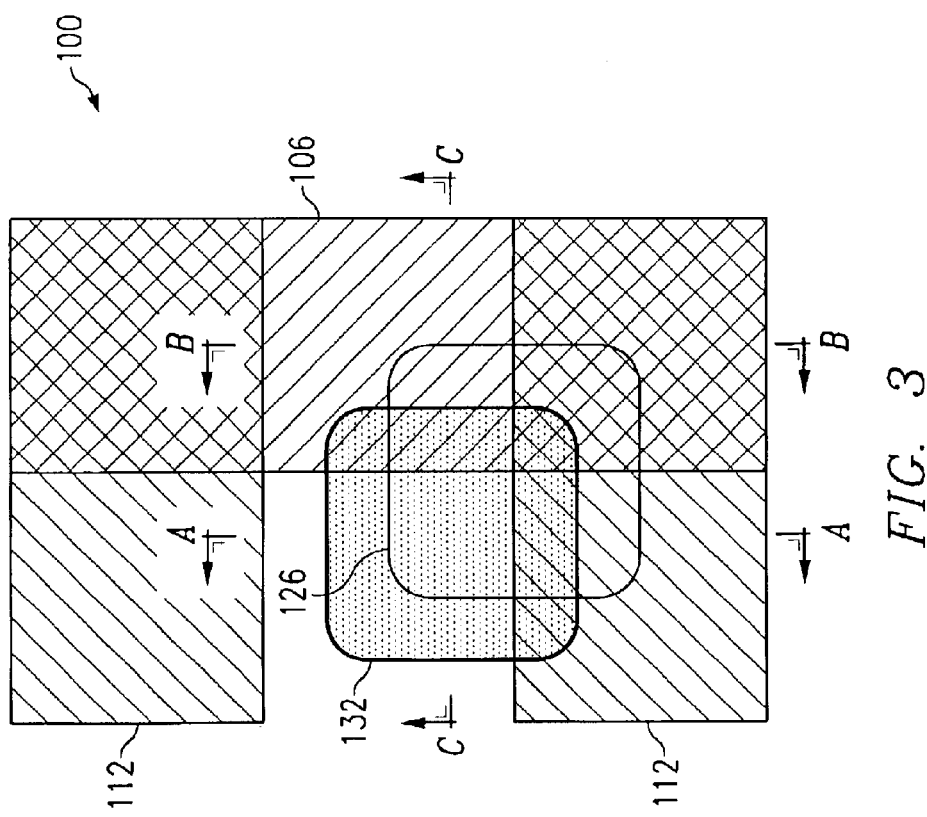
FIG. 3 is an enlarged plan view of a single cell of a DRAM structure according to the present invention.

The DRAM device further comprises a plurality of memory cells 118, outlined with a dashed line in FIG. 1, each of which is associated with an intersection of a given one of the first and second word line edges 108, 110 of a given one of the word lines 106, and with a given one of the first and second bit line edges 114, 116 of a given one of the bit lines 112. For example, the memory cell 118 depicted FIG. 1 is associated with the intersection of the first bit line edge 114 of the indicated bit line 112 and the first word line edge 108 of the indicated word line 106. It will be appreciated that FIGS. 4A–4C depict cross sections in the region of a given one of the memory cells 118, and that FIG. 5 depicts an exploded view in the general region of a single one of the memory cells 118.

Each of the memory cells 118 in turn comprises a pillar 120 of semiconductor material which extends outward from the main outer surface 104 of the substrate 102, and which is electrically isolated from adjacent memory cells. The electrical isolation can be achieved, for example, by trench isolation regions 122 which can be made, for example, of $SiO_2$ or similar materials. The pillar 120 has a pillar outer surface 124 and includes an active region of semiconductor material which is substantially centered inward of the intersection of the given one of the word line edges with the given one of the bit line edges. With reference to FIG. 1, the active regions are designated by outlines 126. The centering with respect to the intersections of the word and bit lines is best seen in FIG. 1. FIGS. 4A through 4C show that the semiconductor pillars 120, which form the active regions, are located inwardly from the word lines 106 and bit lines 112.

Figure 4A:
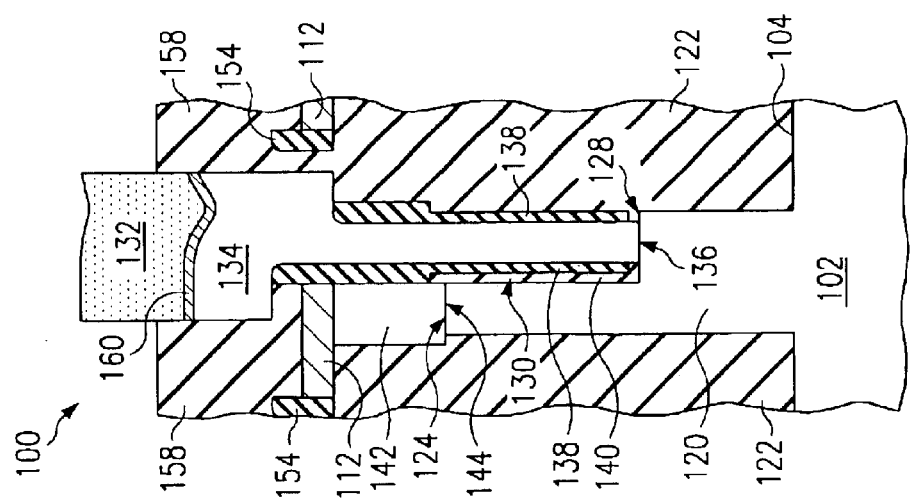
FIG. 4A is a cross-sectional elevation taken along line A—A of FIG. 3.
Figure 4B:
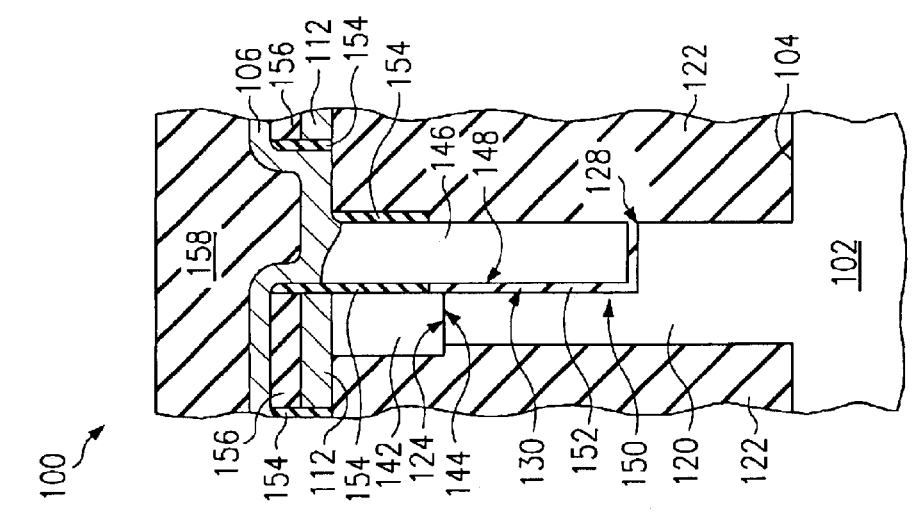
FIG. 4B is a cross-sectional elevation taken along line B—B of FIG. 3.
Figure 4C:
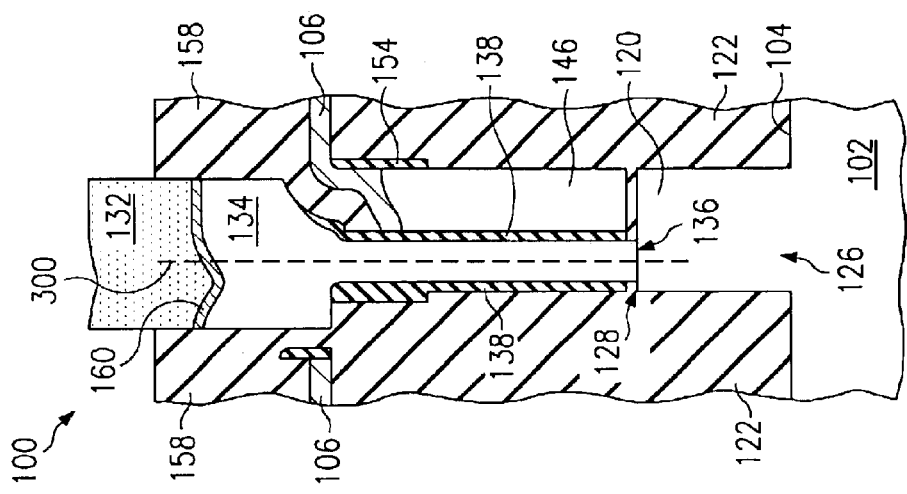
FIG. 4C is a cross-sectional elevation taken along line C—C of FIG. 3.

As best seen FIGS. 4A–4C, the pillars 120 can be formed with a hole region defined by a hole floor 128 and at least one hole wall 130. The hole floor 128 is located outwardly of the main outer surface 104 of the substrate 102.

Each cell of the DRAM device includes a storage node 132 which is offset from the active region 126 of the semiconductor pillar 120 in a direction away from the given one of the word lines 106 and the given one of the bit lines 112. Also included is a storage node plug 134 extending from the storage node 132 through the hole region defined by the hole wall 130 in the pillar 120 so as to contact the hole floor 128. A storage node contact and drain 136 (which could instead be a source, as discussed below) is formed where the storage node plug 132 contacts the hole floor 128. The storage node contact and drain 136 forms the drain of the MOS transistor for each of the given cells. As best seen in FIGS. 4A and 4C, the storage node plug is electrically isolated from the at least one hole wall 130, for example, by a layer of SiN 138 and by a layer of $SiO_2$ 140.

Each of the memory cells 118 also includes a bit line plug 142 which extends from the given one of the bit lines 112 inwardly to contact the outer surface 124 of the pillar 120. Where the bit line plug 142 contacts the outer surface 124, a bit line contact and source 144 is formed for the MOS transistor. Source 144 could instead be a drain. Throughout this application, the drain and source can be interchanged for both the device and the manufacturing method.

Each memory cell 118 also includes a word line plug 146 which extends from the given one of the word lines 106 through the hole region formed by the hole wall 130 in the pillar 120 and which terminates outwardly of the hole floor 128. The word line plug 146 is electrically isolated from the semiconductor material of the pillar 120 such that a portion of the word line plug 146 which is adjacent to and electrically isolated from the semiconductor material of the pillar 120 forms a gate 148 of the MOS transistor. A corresponding portion of the semiconductor material of the pillar 120 forms a channel region 150 of the MOS transistor.

As noted above, the pillars of semiconductor material 120 can be isolated from adjacent pillars by trench isolation regions 122, which can be formed, for example, of $SiO_2$. As also noted, the substrate 102 can be made from silicon. Further, the gate 148 can be isolated from the channel region 150 by a region of gate silicon dioxide 152. The word line width $W_{WL}$, the word line separation distance $D_{WS}$, the bit line width $W_{BL}$, and the bit line separation distance $D_{BS}$ can all be made substantially equal to a characteristic minimum feature size F. In this case, the planform area of each of the memory cells 118 is substantially $4F^2$.

Referring particularly to FIG. 1, it will be seen that the storage nodes 132 can be offset from the active regions 126 all substantially in an identical direction for all of the memory cells 118, if desired.

Figure 2:
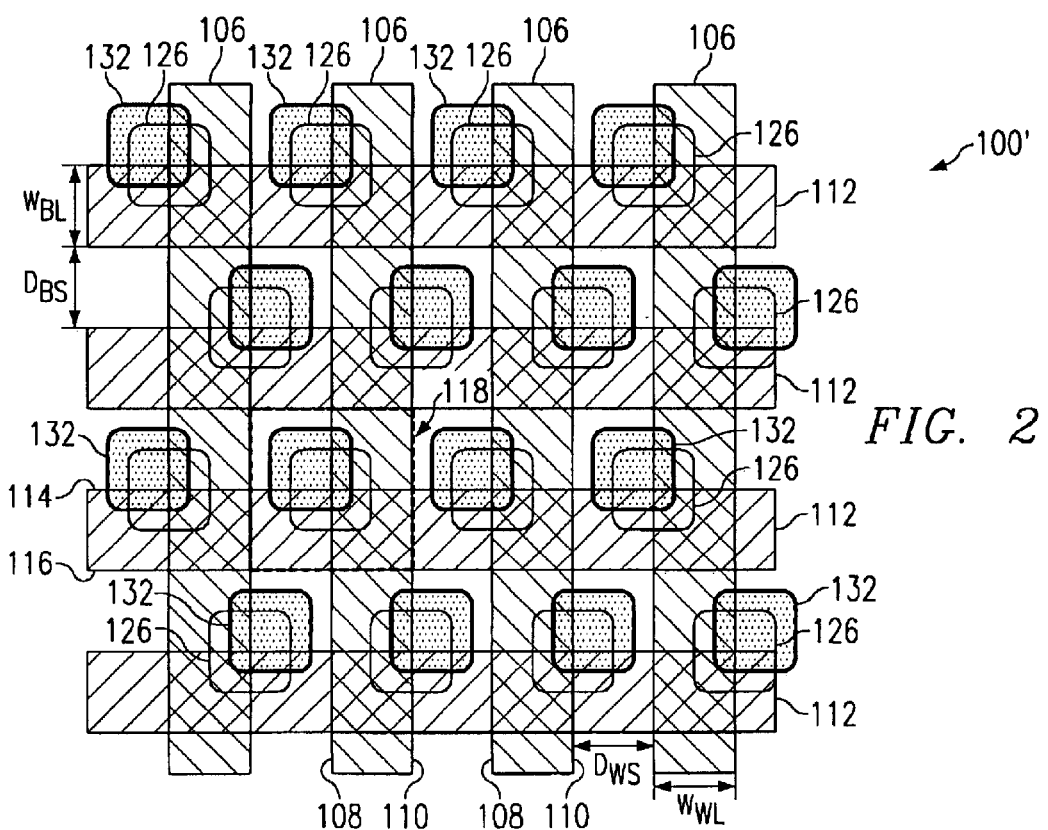
FIG. 2 is a plan view of a second embodiment of a DRAM structure according to the present invention.

Reference should now be had to FIG. 2, which is of an alternative embodiment of the present invention 100'. Elements in FIG. 2 which are the same as those in FIG. 1 have received the same reference numeral. The difference between the FIG. 2 embodiment and the FIG. 1 embodiment is as follows. In FIG. 1, the direction in which the storage node 132 is offset from the active region 126 is substantially identical for all memory cells. In FIG. 2, the direction is substantially identical for all memory cells associated with a given one of the bit lines 112, however, the direction is opposite, in a direction substantially parallel to the bit lines 112, for all the memory cells 118 which are associated with an adjacent one of the bit lines 112.

Figure 57:
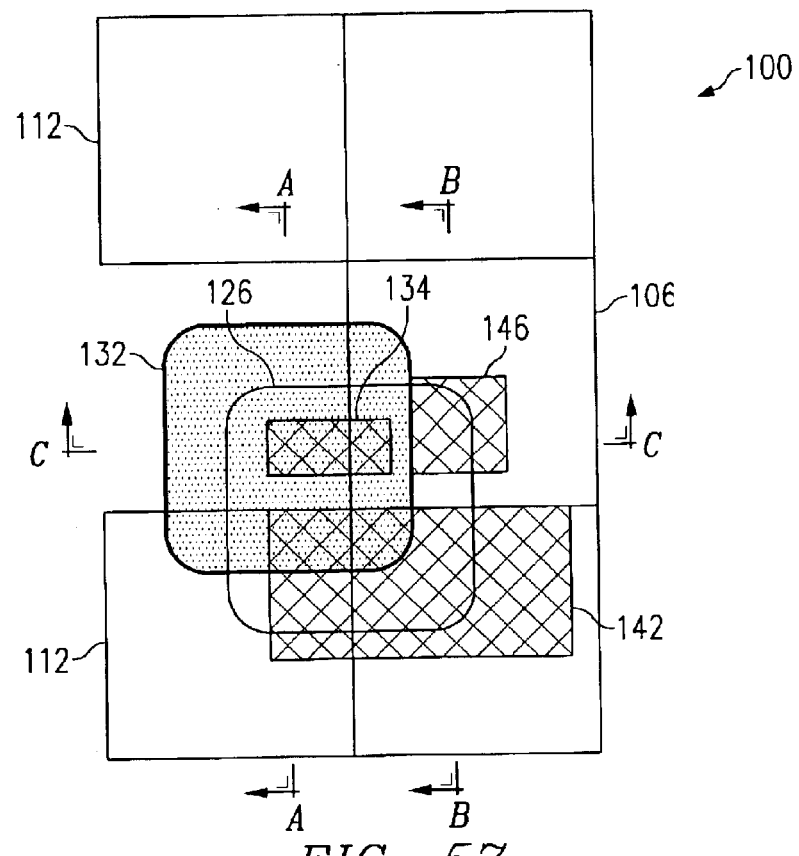
FIG. 57 is a schematic, cross-sectional plan view through a memory cell of the present invention.

As noted above, one desirable feature of the present invention is the asymmetrical nature of the memory cells 118, as compared to the prior art, which permits the various components to be formed as relatively thick, unitary structures rather than thin-walled symmetrical regions. Reference should now be had to FIG. 57. FIG. 57 is a cross-sectional plan view, in semi-schematic form, depicting the storage-node plug 134, bit line plug 142, and word line plug 146 of a given memory cell 118. The elements shown in FIG. 3, including the section lines A—A, B—B and C—C, have been shown in FIG. 57 in outline form, for reference. It will be appreciated that each of the storage node plug 134, bit line plug 142, and word line plug 146 has an outline when viewed in the plan view. At least two of the plugs 134, 142, 146 are not enclosed by the outlines of any of the other plugs 134, 142, 146. In the exemplary form shown, all three of the plugs 134, 142, 146 are not enclosed by any of the outlines of any of the other plugs. As shown in FIG. 57, the plugs 134, 142, 146 can all be substantially solid when viewed in plan. Further, they can form the above-mentioned substantially asymmetric structure. With reference to FIG. 57, as well as FIGS. 4-A through 4-C and FIG. 5, it will be appreciated that there can be overlap between the different plugs at different levels, as best seen in FIG. 4A and FIG. 4C. However, none of the plugs need be enclosed by any of the other plugs, when viewed in plan at any given section, as shown in the drawings. Thus, the thickness of each plug can be selected for ease in manufacturing, and is not dependent on a double-thickness symmetrical structure, as with the prior art discussed above.

With reference now to FIG. 4A, each memory cell 118 can include, if desired, additional regions of SiN 154, for purposes which will be appreciated in the discussion of the manufacturing method which follows. Further, each of the bit lines 112 can have a SiO$_2$ portion 156 for purposes which will also be apparent with reference to the manufacturing method discussed below. Additional insulation, which can be, for example, SiO$_2$ can be applied as shown at 158, in order to enclose the bit lines 112 and to become unitary with the trench isolation regions 122. A layer of TiN 160 can be provided between the storage node 132 and the storage node plug 134, again, for reasons which will be appreciated when the manufacturing method is discussed below.

A method, according to the present invention, of manufacturing the inventive dynamic random access memory device will now be described. Continued reference should be had to FIGS. 1–5, and exemplary method steps for one possible manufacturing method will also be discussed in detail with respect to FIGS. 6A–6C through 56A–56C. The method comprises the steps of (a) providing a substrate of semiconductor material 102 having a main outer surface 104; (b) forming a plurality of pillars of semiconductor material 120; (c) forming a plurality of substantially parallel bit lines 112; (d) interconnecting the bit lines 112 with outer surfaces 124 of the pillars 120; (e) forming at least one hole region in each of the plurality of pillars 120; (f) forming a plurality of substantially parallel word lines 106; (g) locating a word line plug 146 in each of the hole regions; (h) forming a plurality of storage nodes 132; and (i) interconnecting the storage nodes 132 with hole floors 128 of the hole regions in the pillars 120.

In step (a), the substrate can have main outer surface 104. In step (b), the plurality of pillars 120 can extend outward from the main outer surface 104 of the substrate 102, and each of the pillars 120 can have a pillar outer surface 124. The pillars can be formed using a first mask, as discussed further below with respect to FIGS. 6A–6C through 56A–56C. The pillars 120 can be electrically isolated from each other and can include an active region 126 of the semiconductor material.

Step (c) can include forming the bit lines 112 such that they are located outwardly of the main outer surface 104 of the substrate 102. Each of the bit lines 112 can have a bit line width W$_{BL}$, as discussed above, which can be defined by the first and second bit line edges 114, 116. As discussed above for the apparatus, each of the bit lines can be separated from adjacent bit lines by a bit line separation distance D$_{BS}$. The bit lines 114 can be formed using a second mask, as will be discussed further below.

In step (d) the bit lines 112 can be interconnected with the pillar outer surfaces 124 via a plurality of bit line plugs 142 so as to form a plurality of bit line contacts and sources 144 of the plurality of MOS transistors. As before, sources 144 can instead be drains. The bit line contacts and sources 144 can be formed at the intersections of the bit line plugs 142 with the pillar outer surfaces 124, as discussed above. The formation of the bit line contact and source 144 can occur by auto diffusion from the plug 142.

In step (e), the at least one hole region which is formed can be defined by the hole floor 128 and the at least one hole wall 130 in each of the plurality of pillars 120. The hole floors 128 can be located outwardly of the main outer surface 104 of the substrate 102, as discussed above with respect to the apparatus.

In step (f), the plurality of substantially parallel word lines 106 can be located outwardly of the main outer surface 104 of the substrate 102, and each can have a word line width defined by first and second word line edges and separated from adjacent word lines by a word line separation distance, all as discussed above. The word lines 106 can be substantially perpendicular to the bit lines 112. The word lines 106 can be formed using a third mask, as will discussed below. As discussed above, and with reference again to FIG. 1, a given one of the first and second word line edges 108, 110 and a given one of the first and second bit line edges 114, 116 can intersect substantially outward of a center portion of a given one of the active regions 126. The outward placement of the word lines and bit lines from the active region is best seen in FIGS. 4A–4C.

In step (g), each of the word line plugs 146 can extend from a corresponding adjacent one of the word lines 106 inwardly into the hole region defined by the hole wall 130, and can terminate outwardly of the hole floor 128. Each of the word line plugs 146 can be electrically isolated from the semiconductor material of the pillar 120, as discussed above, such that a portion of each of the word line plugs 146 adjacent to and electrically isolated from the semiconductor material of the pillar 120 forms a gate 148 of the MOS transistor, and such that a corresponding portion of the semiconductor material of the pillar 120 forms a channel region 150 of the MOS transistor.

With reference to step (h), one storage node 132 can be formed for each of the active regions 126, and each of the storage nodes 132 can be offset from the corresponding one of the active regions 126 as described above. The storage nodes 132 can be formed using a fourth mask, as will be discussed below.

In step (i), the storage nodes 132 can be interconnected with the hole floors 128 of the pillars 120 via a plurality of storage node plugs 134. Where the storage node plugs 134 intersect the hole floors 128, a plurality of storage node contacts and drains 136 can be formed, for example, by auto diffusion from the plug 134. Again, the drains can instead be sources. The storage node plugs 134 can extend through the hole regions in the pillars and can be electrically isolated from the hole walls 130 and the word line plugs 146, as discussed above.

The method can further comprise the additional step of forming a plurality of trench isolators, or trench isolation regions, 122 between the pillars 120 to obtain the required electrical isolation. Further, the method can further comprise the additional step of forming a layer of gate SiO$_2$ 152 between each of the gates 148 and the corresponding portions of the semiconductor material of the pillars 120, as discussed above.

In the method, step (c) can comprise forming the bit lines 112 such that the bit line width and separation distance are both substantially equal to the characteristic minimum feature size F, discussed above, while step (f) can comprise forming the word lines 106 such that the word line width and word line separation distance are also both substantially equal to the characteristic minimum feature size F, as discussed above. Thus, the planform area of each of the plurality of memory cells 118, one each of which is formed at each of the plurality of pillars 120, will be substantially 4F$^2$, as discussed above.

Step (h) can comprise forming the storage nodes 132 such that the direction in which each of the storage nodes 132 is offset from its corresponding one of the active regions 126 is substantially identical for all of the storage nodes 132. The resulting structure has been discussed above with reference to FIG. 1, embodiment 100. Alternatively, step (h) can comprise the sub-step of forming those of the storage nodes 132 which are associated with even-numbered bit lines 112 with the direction in which each of the storage nodes is offset from its corresponding one of the active regions 126 substantially identical. Further, step (h) can also comprise the sub-step of forming those of the storage nodes 132 which are associated with odd numbered bit lines 112 each offset from its corresponding one of the active regions 126 in a substantially identical direction, which is opposite to the offset direction for those of the storage nodes associated with the even numbered bit lines. The offset can be substantially parallel to the bit lines 112. In performing these sub-steps, the embodiment 100' illustrated in FIG. 2 above can be obtained. It will be appreciated that appropriate odd and even numbering can be selected for the bit lines 112.

Reference should again now be had to FIG. 57 and the above discussion with respect to FIG. 57. It will therefore be appreciated that step (d) can comprise forming the bit line plugs 142 such that they have a bit line plug outline when viewed in plan view, as in FIG. 57. Further, step (g) can comprise forming the word line plugs 146 such that they have a word ling plug outline when viewed in plan view. Yet further, step (i) can comprise forming the storage node plugs 134 such that they have a storage node plug outline when viewed in plan view. The plugs 132, 142, 146 can be shaped such that at least two of the plugs are not enclosed by any of the outlines of any of the other plugs. In the embodiment illustrated, all three of the plugs are not enclosed by any of the outlines of any of the other plugs. As discussed above, there can be some "overlap" of the plugs at different levels, as best seen in the cross-sectional views 4A through 4C. The shaping step can be performed such that all of the plugs 134, 142, 146 are solid when viewed in plan, as shown in FIG. 57 and discussed above. The plugs can also be shaped such that they form a substantially asymmetric structure when viewed in plan, as shown in FIG. 57 and discussed above.

Figure 6A:
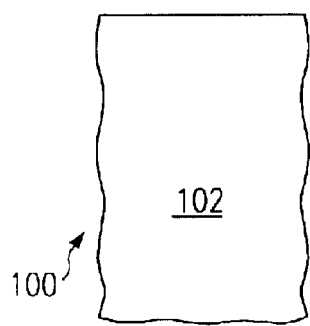
Figure 6B:
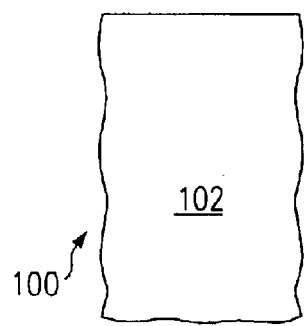
Figure 6C:
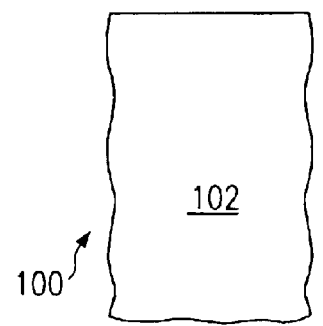
Figure 7A:
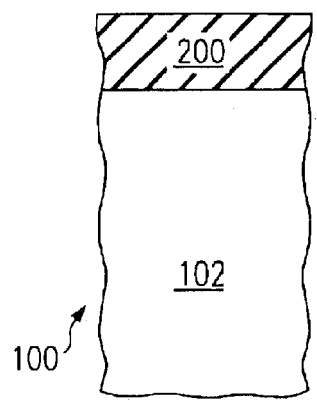
Figure 7B:
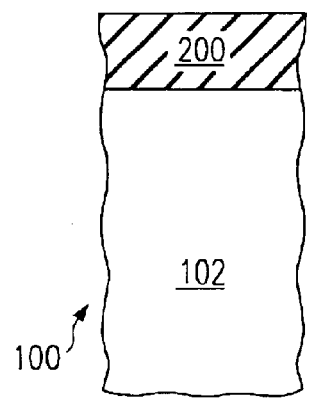
Figure 7C:
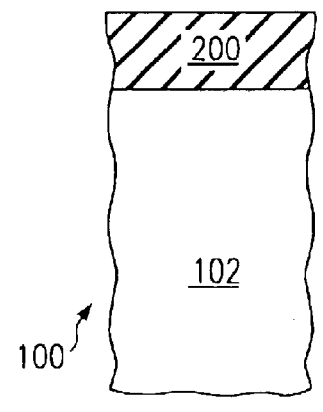
Figure 8A:
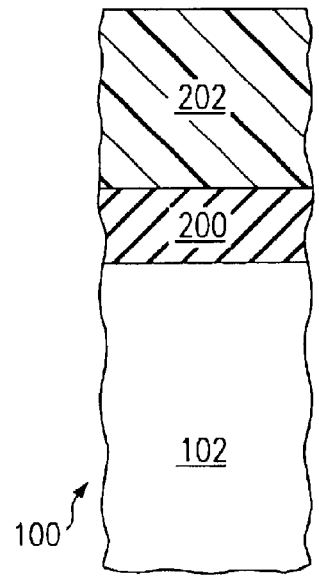
Figure 8B:
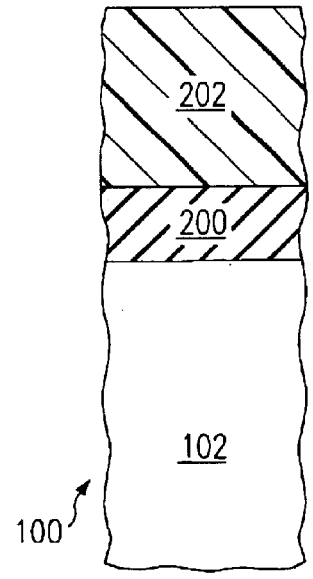
Figure 8C:
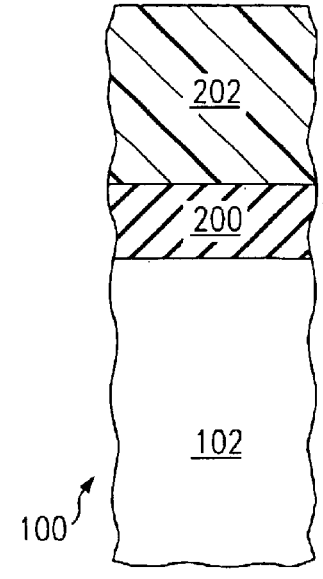
Figure 20A:
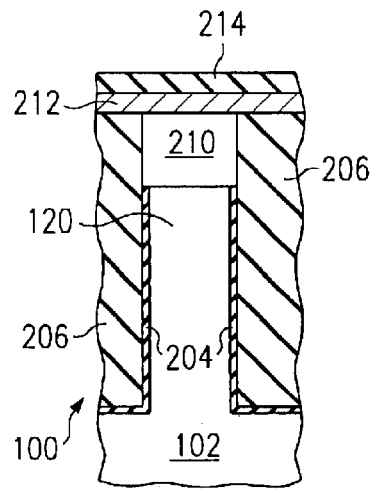
Figure 20B:
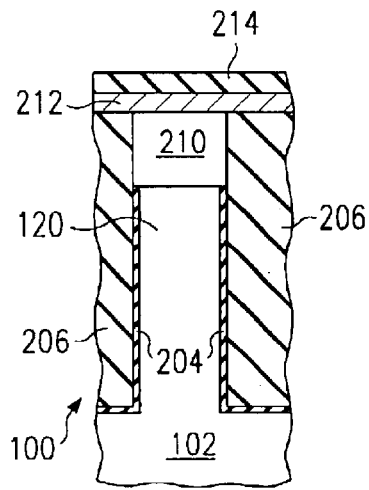
Figure 20C:
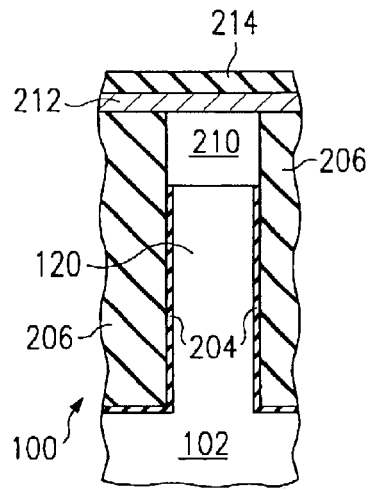
Figure 21A:
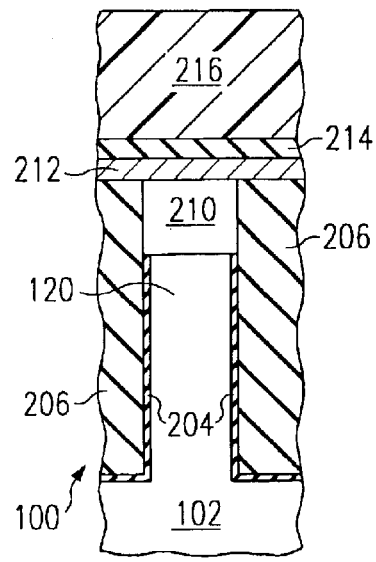
Figure 21B:
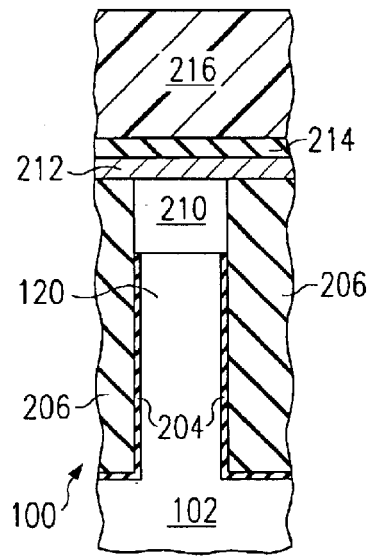
Figure 21C:
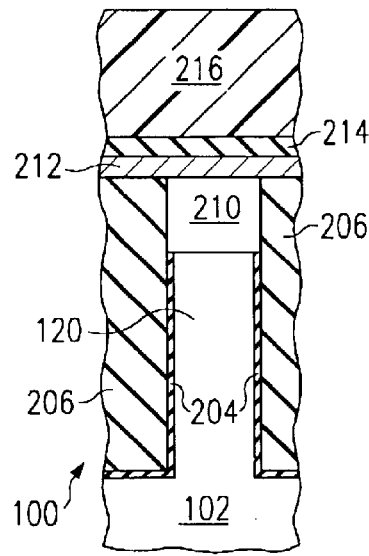

Attention should now be given to FIGS. 6A–6C through 56A–56C, for a description of one specific manner in which the manufacturing method of the present invention can be carried out. It should be noted that the specific method shown in the figures is exemplary, and that the method can be implemented in other fashions as well. As shown in FIGS. 6A–6C, a substrate 102 can initially be provided; for example, a silicon substrate can be provided. Referring now to FIGS. 7A–7C, a layer of SiN, or similar insulating material with preferential etching qualities, is then deposited on top of the substrate 102. With reference next to FIGS. 8A–8C, a suitable layer of photoresist 202 can then be applied over the SiN layer 200.

With reference next to FIGS. 9A–9C, the resist layer 202 can be patterned in the shape of the aforementioned active regions 126, using a first mask. With reference to FIGS. 10A–10C and 11A–11C, the SiN layer 200 can be etched back to the substrate 102 so that it only remains beneath the photoresist 202, and the photoresist can then be removed.

With reference to FIGS. 12A–12C, the substrate 102 can be etched so as to form the pillars 120 of semiconductor material discussed above. As shown in FIGS. 13A–13C, the silicon in the substrate 102, including that in pillar 120, can then be oxidized to form an SiO$_2$ layer 204. With reference now to FIGS. 14A–14C through 16A–16C, additional SiO$_2$ can be deposited, and polished down to the level of the SiN layer 200, which can subsequently be removed. As shown in FIGS. 16A–16C, void regions 208 are formed where the SiN layer 200 is removed. As shown in FIGS. 17A–17C and 18A–18C, the voids 208 can subsequently be filled via deposition of polysilicon 210 (or other desirable material) which can then be polished down to the level of the additional SiO$_2$ 206.

With attention now to FIGS. 19A–19C through 21A–21C, a layer of tungsten 212, or other desirable contact material, can be sputtered or otherwise applied over the additional silicon dioxide 206 and polysilicon 210. An additional layer of SiO$_2$ 214 can then be deposited (or another insulator with suitable preferential etching characteristics). Finally, an additional resist layer 216 can be applied.

Figure 22A:
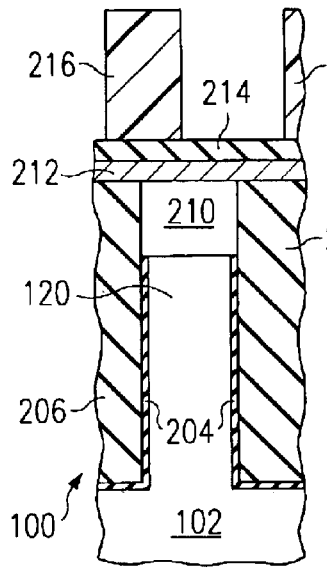
Figure 22B:
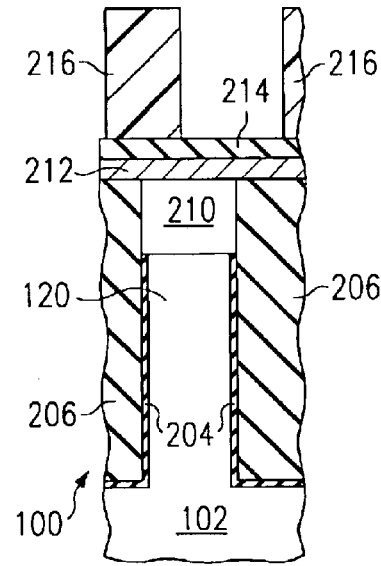
Figure 22C:
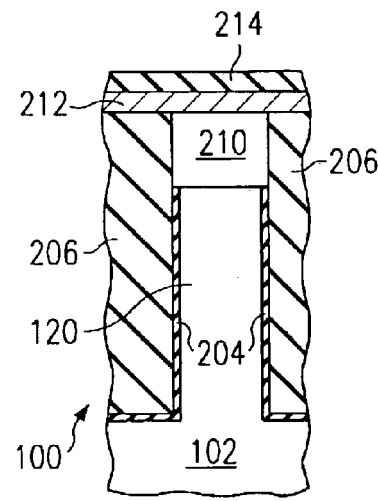
Figure 23A:
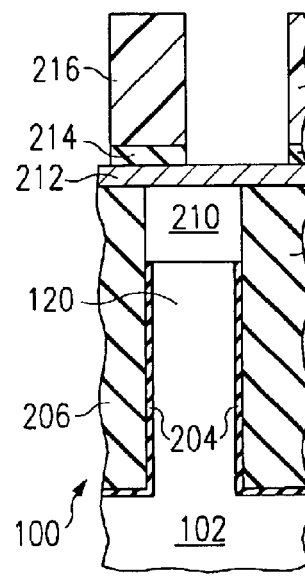
Figure 23B:
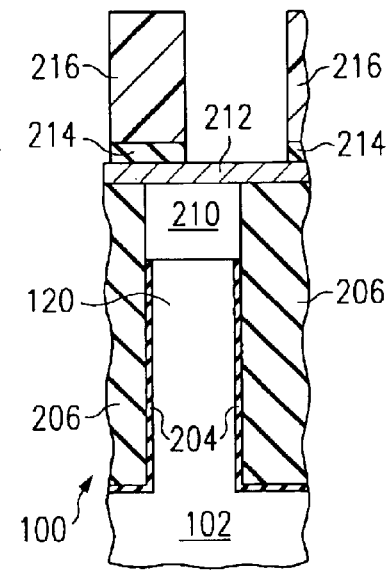
Figure 23C:
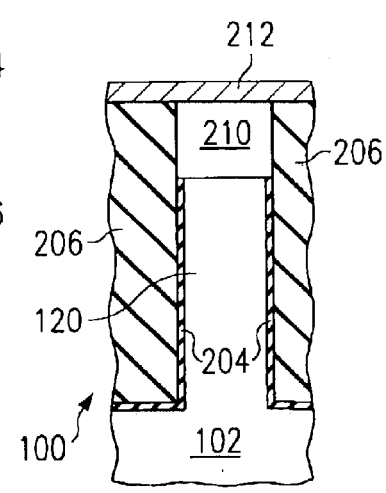

With reference now to FIGS. 22A–22C, the additional resist 216 can be patterned using a second mask in order to form the above-discussed bit lines 112. The additional silicon dioxide 214 which is not protected by the additional resist 216 can then be etched away, as shown in FIGS. 23A–23C. Subsequently, the tungsten 212 which is not protected by the additional resist 216 can also be etched away, as shown in FIGS. 24A–24C. As shown in FIGS. 25A–25C and 26A–26C, those regions of the polysilicon 210 which are not protected by the additional resist layer 216 can be etched down to a thin film 218 and the additional resist 216 can then be removed.

Attention should now be given to FIGS. 27A–27C and 28A–28C. As shown therein, a thin film of SiN 220 can be deposited over the upper surfaces of the structure remaining after the steps depicted up to and including FIGS. 26A–26C have been performed. It can then be etched away, on the horizontal surfaces only, to leave the vertical thin films of SiN 220 depicted in FIGS. 28A–28C. Again, an alternative insulating material with suitable preferential etching qualities could be used instead of the SiN.

Figures 29A, 29B, 29C:
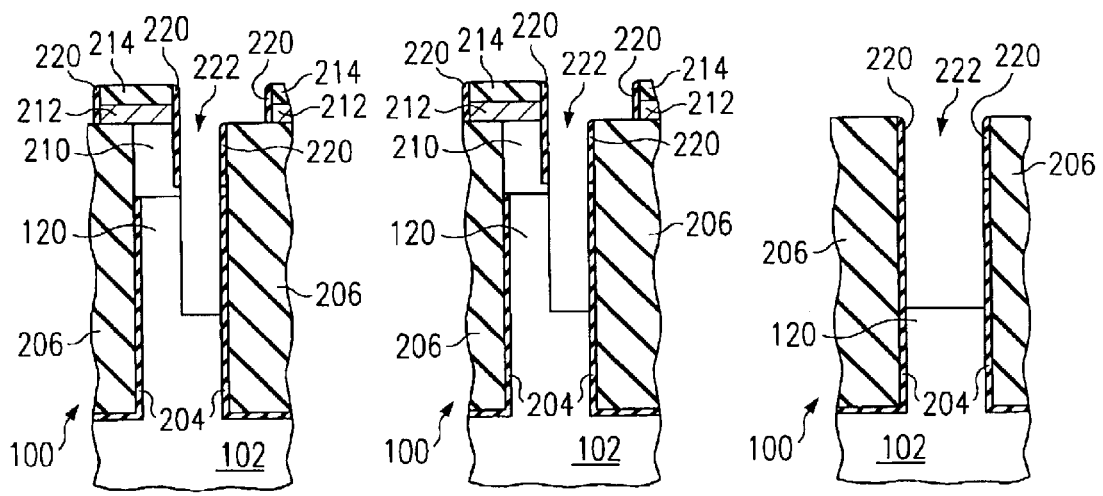
Figures 30A, 30B, 30C:
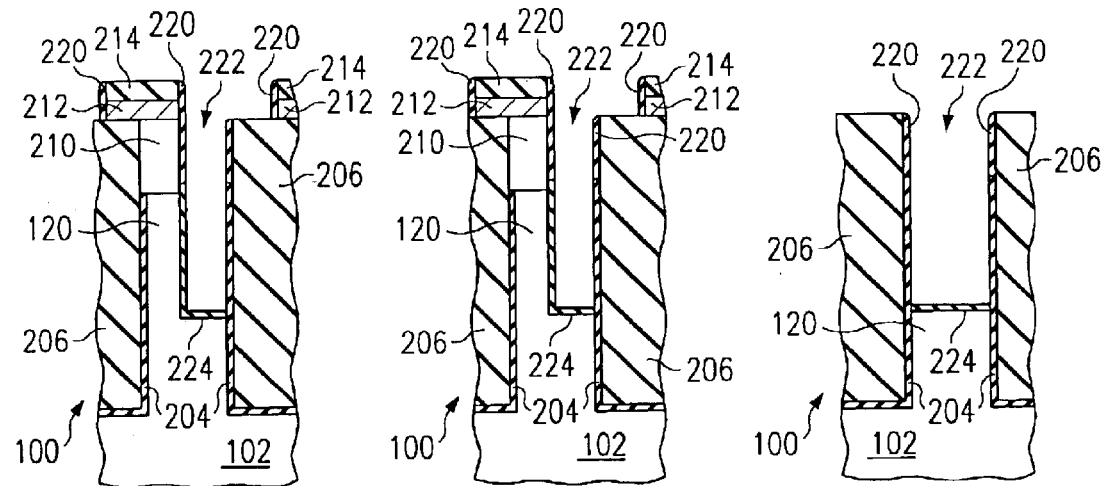
Figures 31A, 31B, 31C:
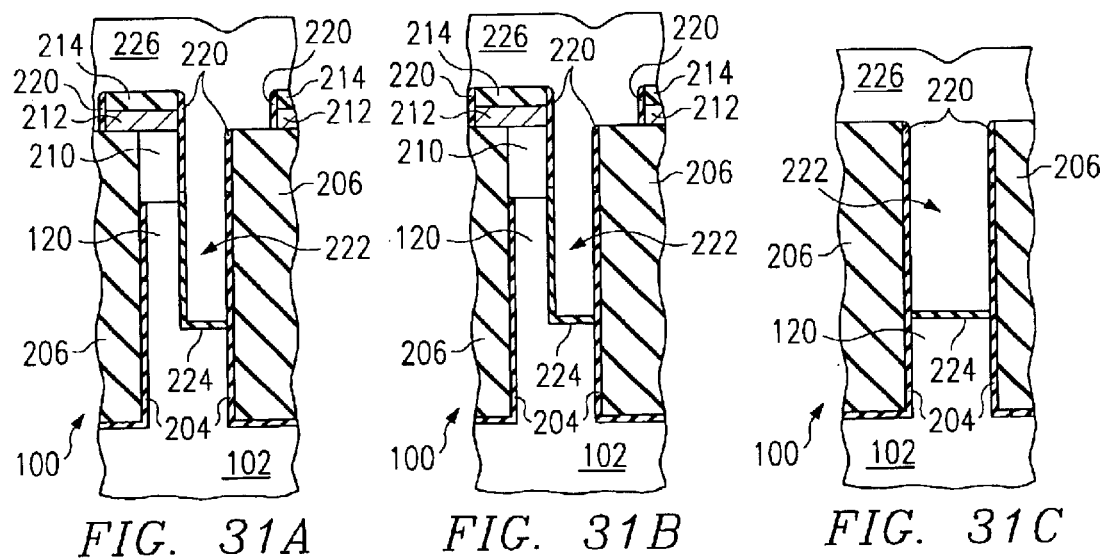

As shown in FIGS. 29A–29C, a portion of the silicon or other semiconductor material in the pillar 120 can be etched away to form the aforementioned hole region. The hole region is designated as 222 in the drawings depicting the exemplary manufacturing process. It will be appreciated that a corresponding portion of the SiN thin film 220 is also etched through as the hole region 222 is formed. With attention to FIGS. 30A–30C, the portion of the silicon or other semiconductor in the pillar 120 which is exposed as the hole region 222 is formed can be oxidized to form an SiO$_2$ layer 224. As shown in FIGS. 31A–31C and 32A–32C, additional polysilicon 226 can be deposited and subsequently etched back.

Figure 32A:
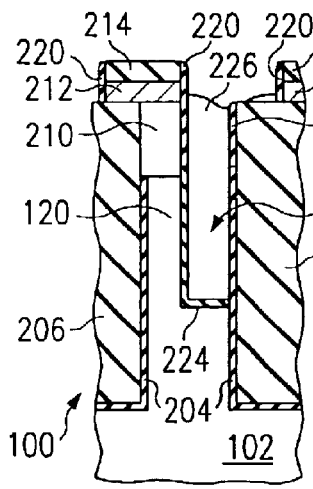
Figure 32B:
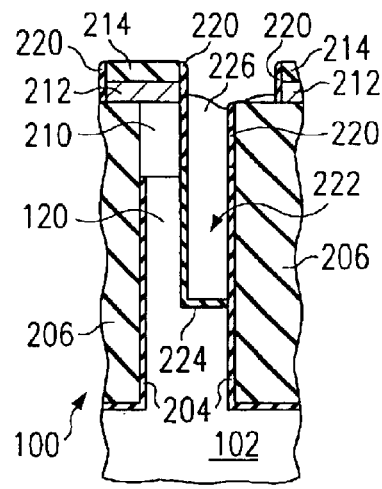
Figure 32C:
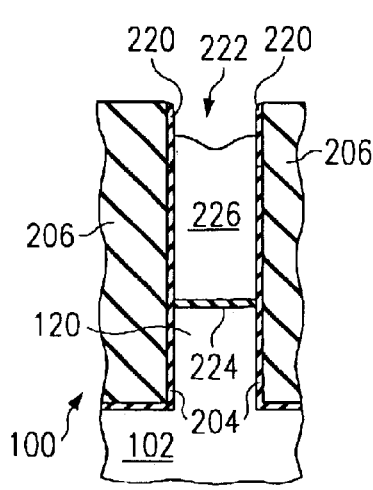
Figure 33A:
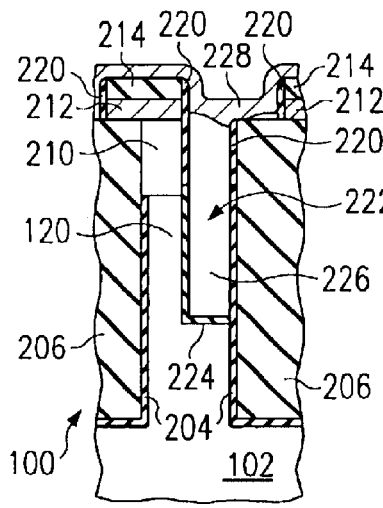
Figure 33B:
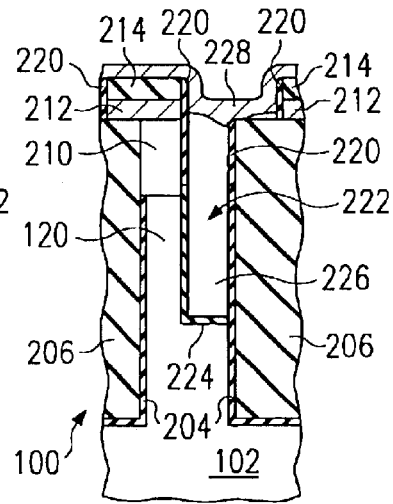
Figure 33C:
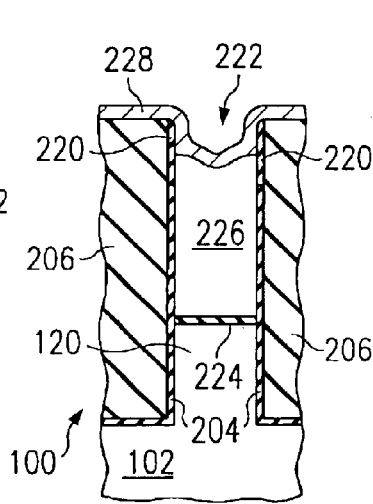
Figure 34A:
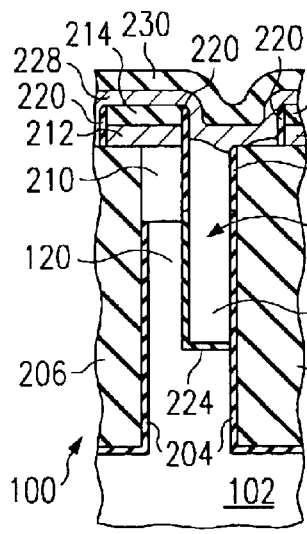
Figure 34B:
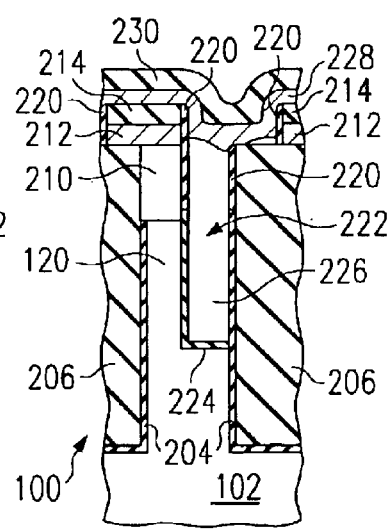
Figure 34C:
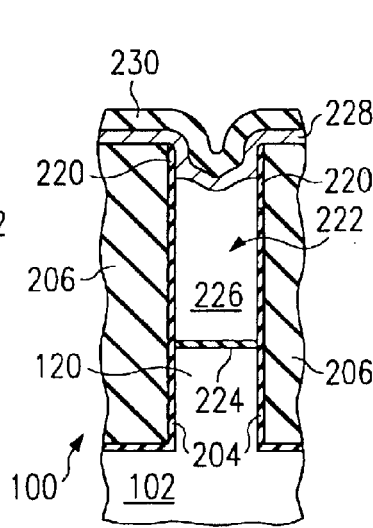
Figure 39A:
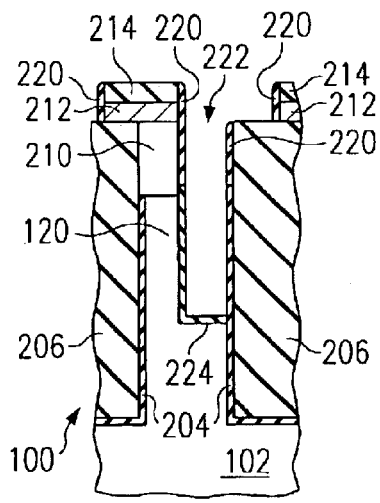
Figure 39B:
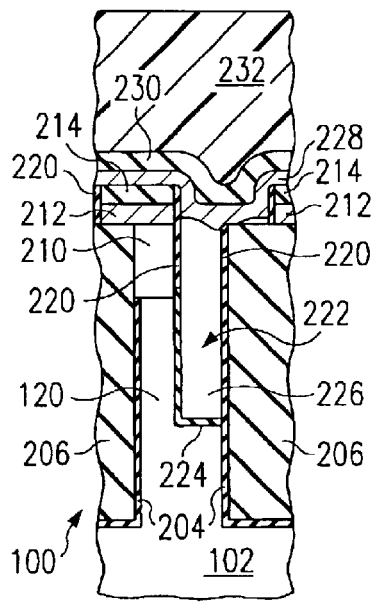
Figure 39C:
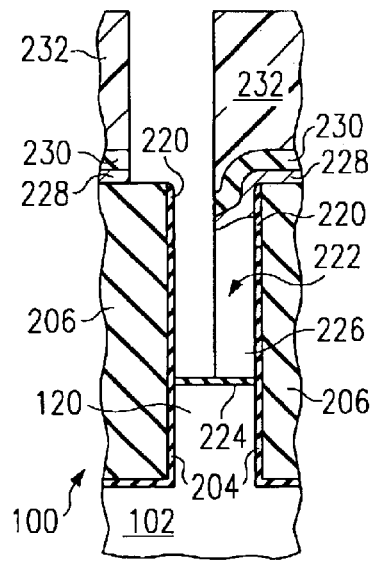
Figure 40A:
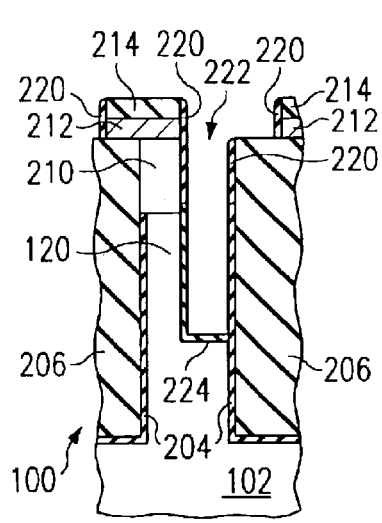
Figure 40B:
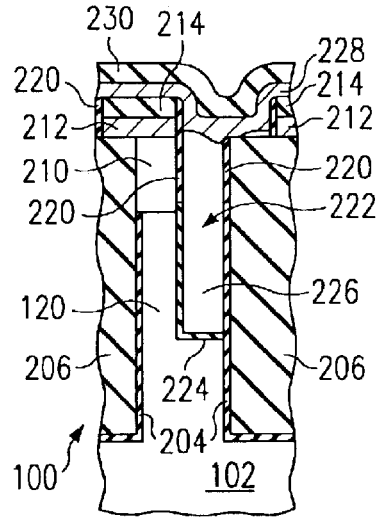
Figure 40C:
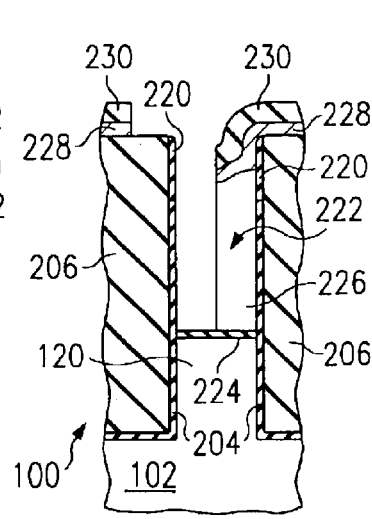
Figure 41A:
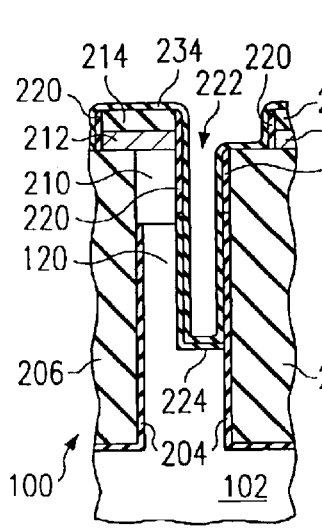
Figure 41B:
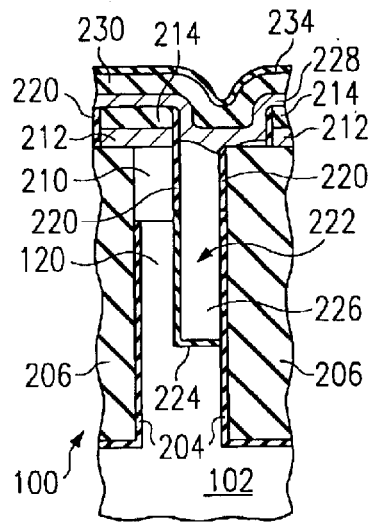
Figure 41C:
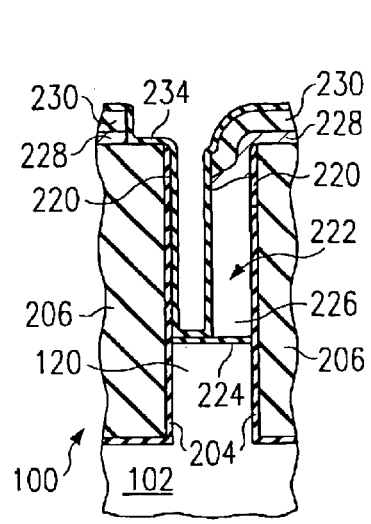
Figure 42A:
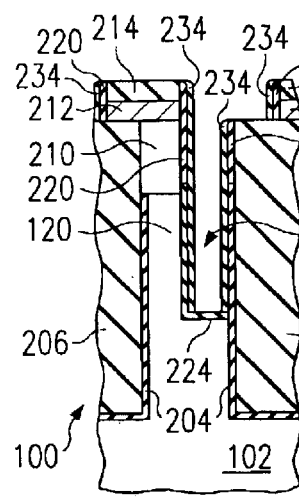
Figure 42B:
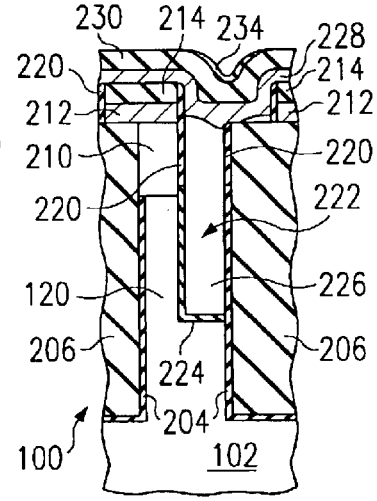
Figure 42C:
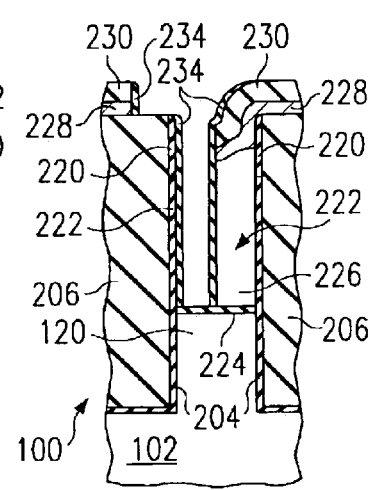

With reference now to FIGS. 33A–33C through 35A–35C, an additional tungsten layer 228 can be sputtered onto the upper surfaces of the structure resulting at the end of the steps depicted up to and including FIGS. 32A–32C. As an alternative to sputtering of the tungsten layer 228, TiN can be sputtered and the tungsten 228 can be deposited. Further, it is to be understood that other desirable conductors could be used instead of tungsten. A further SiO$_2$ layer 230 can be deposited over the tungsten layer 228, and a third resist coat 232 can subsequently be applied. With reference to FIGS. 36A–36C, the third resist coat 232 can be patterned using a third mask so as to form the aforementioned word lines 106.

Those portions of the SiO$_2$ layer 230 and additional tungsten layer 228 which are not protected by the third resist coat 232 can be etched away, as shown in FIGS. 37A–37C and 38A–38C. It will be appreciated that some incidental etching of the additional polysilicon 226 may also occur during the etching of the additional tungsten 228, as shown. With reference to FIGS. 39A–39C and 40A–40C, the additional polysilicon 226 which is not protected by the third resist coat 232 can be etched away, and the third resist coat 232 can then be removed. As shown in FIGS. 41A–41C and 42A–42C, an additional SiN thin film 234 can be deposited and the horizontal surfaces thereof can subsequently be etched, to result in a number of substantially vertical portions of the SiN thin film 234. It will be appreciated that the additional SiN thin film 234, in some locations, is in intimate contact with the SiN thin film 220 previously discussed. Accordingly, in these locations where the two films are immediately adjacent to each other, the SiN thin film 220 will not be separately labeled after FIGS. 41A–41C, for convenience.

Figure 43A:
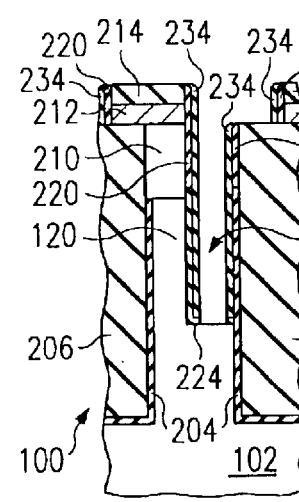
Figure 43B:
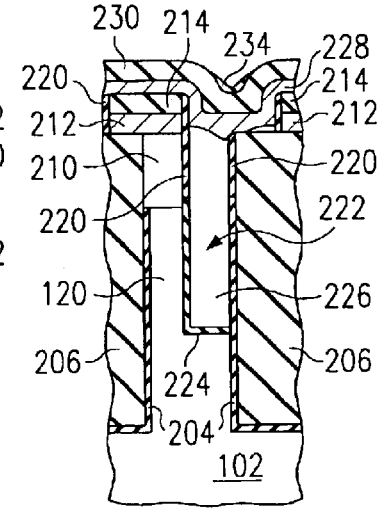
Figure 43C:
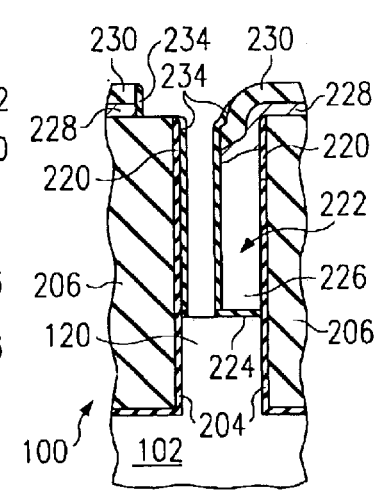
Figure 44A:
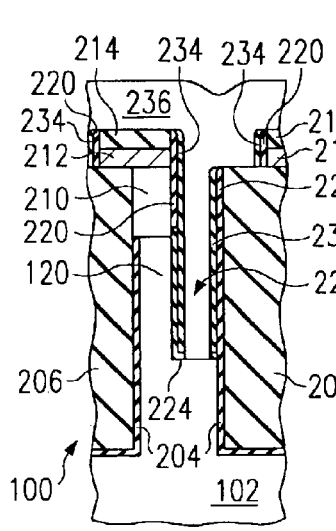
Figure 44B:
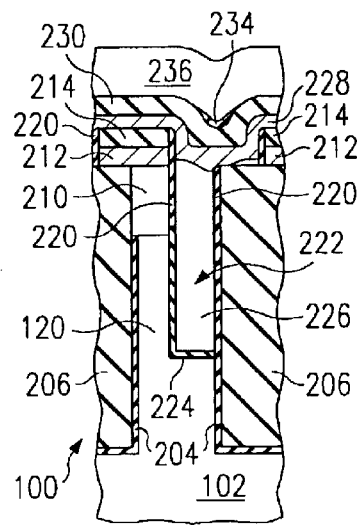
Figure 44C:
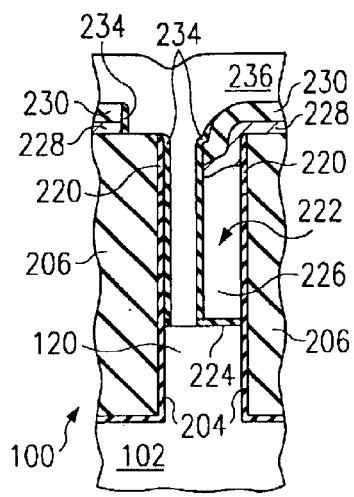
Figure 45A:
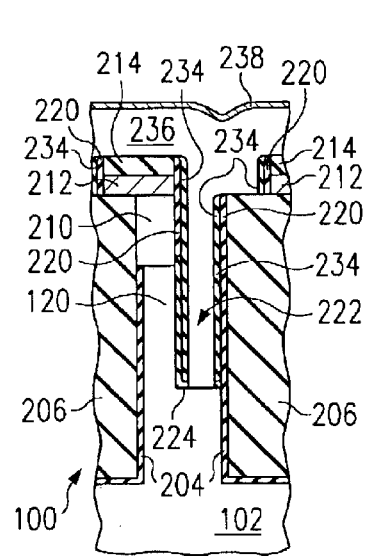
Figure 45B:
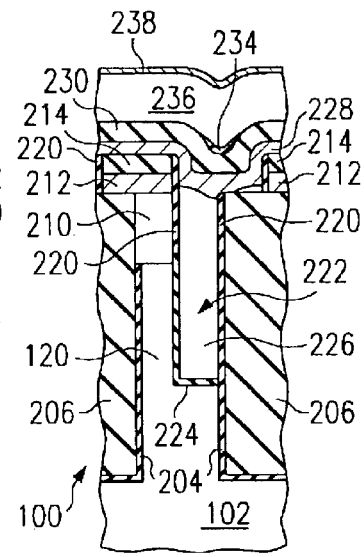
Figure 45C:
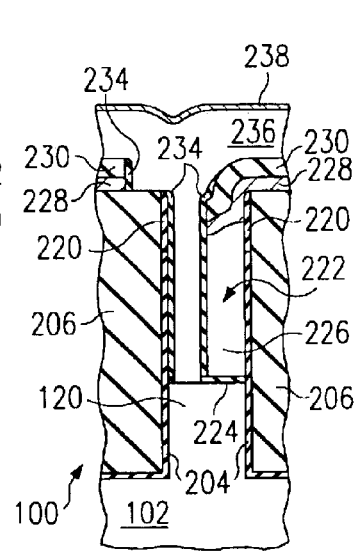
Figure 46A:
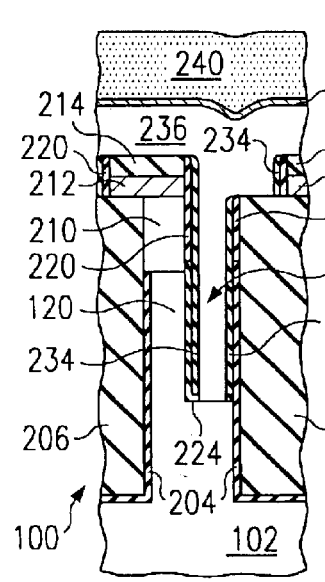
Figure 46B:
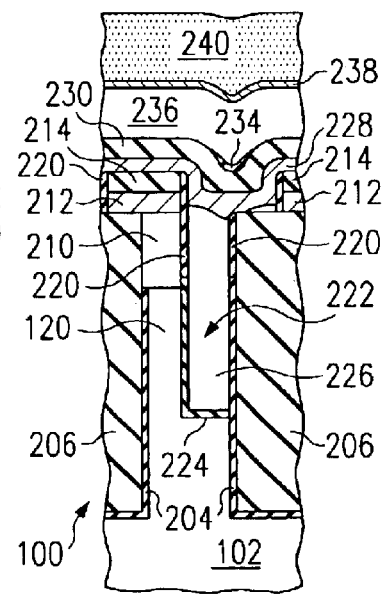
Figure 46C:
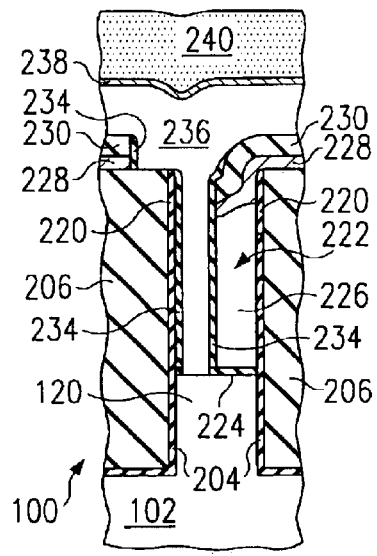
Figure 47A:
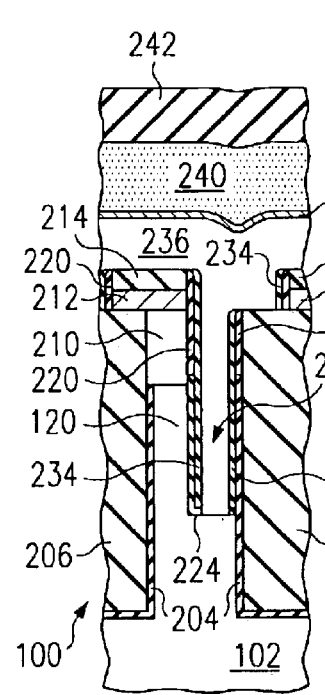
Figure 47B:
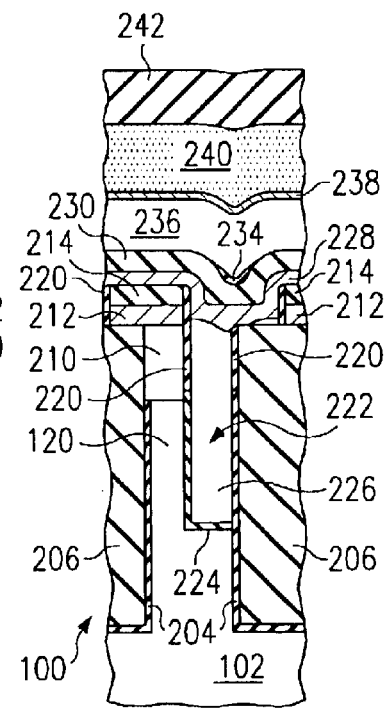
Figure 47C:
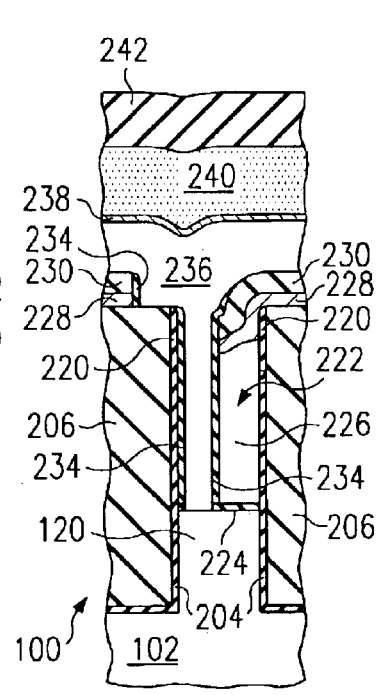
Figure 48A:
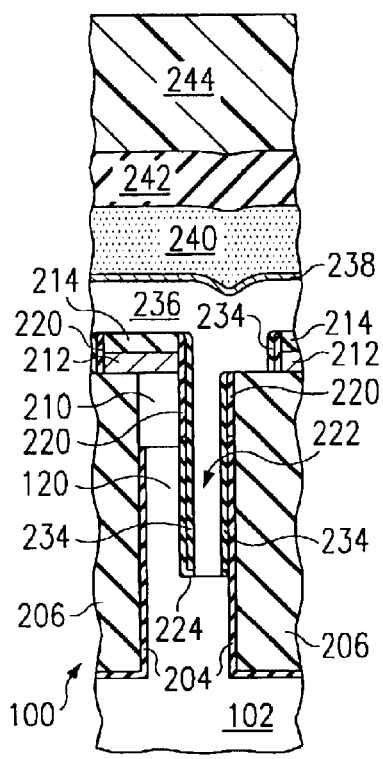
Figure 48B:
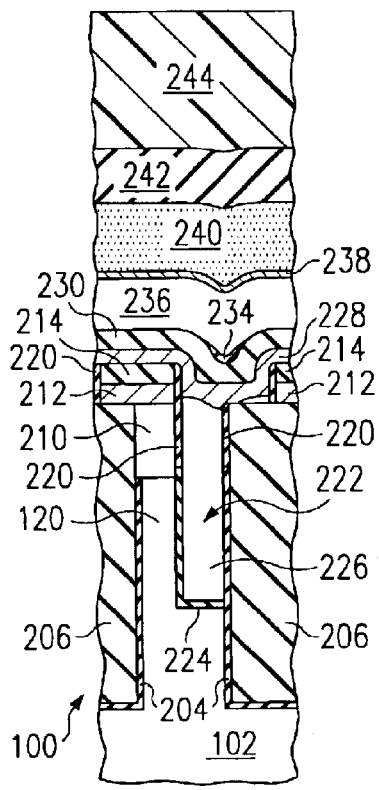
Figure 48C:
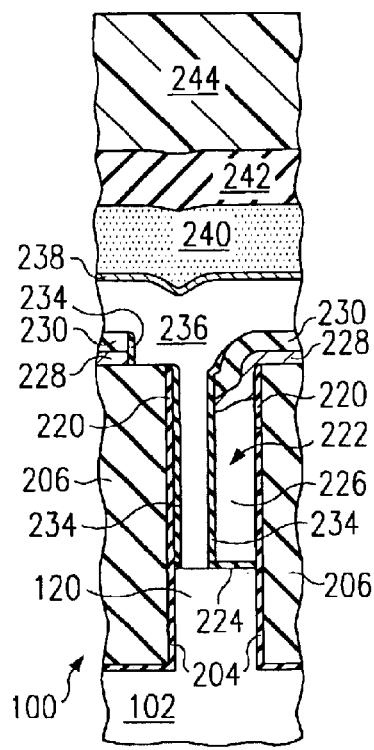
Figure 49A:
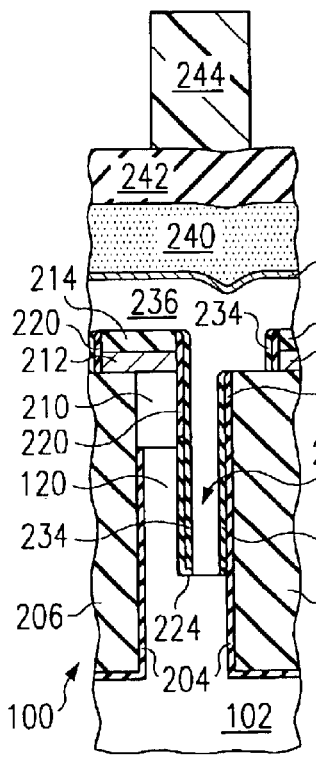
Figure 49B:
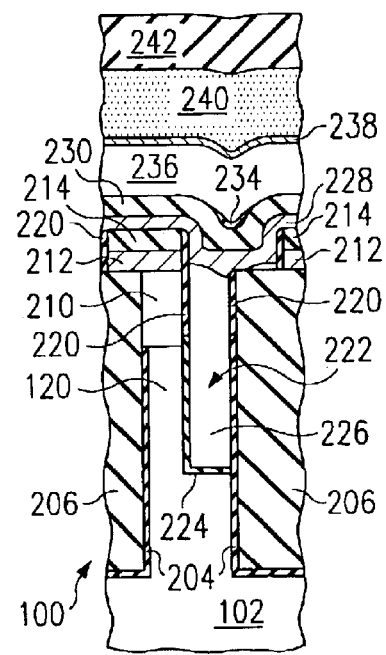
Figure 49C:
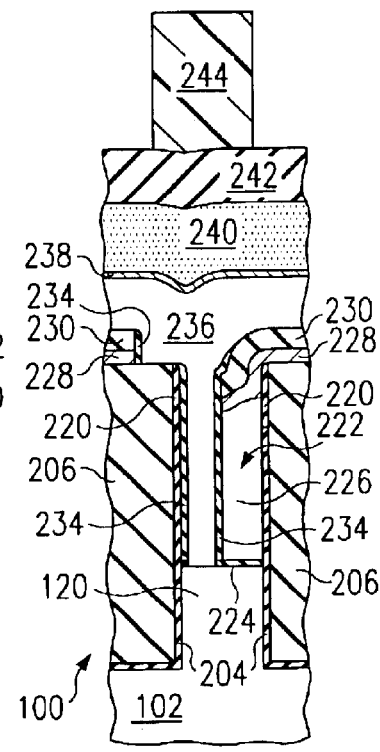
Figure 54A:
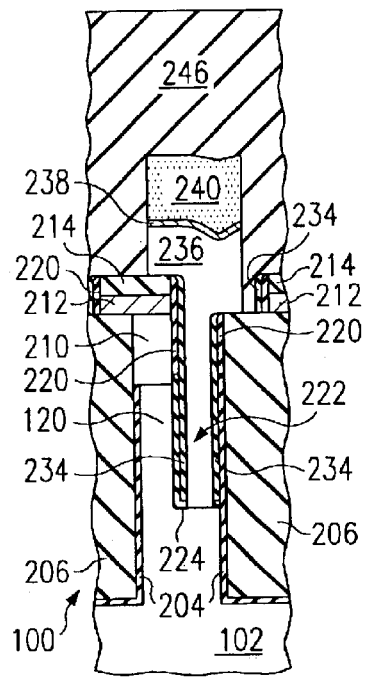
Figure 54B:
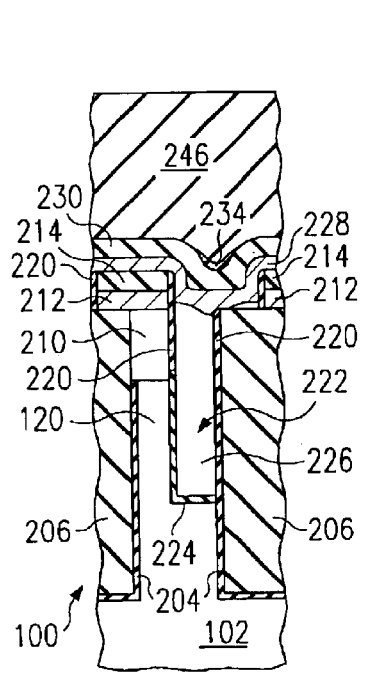
Figure 54C:
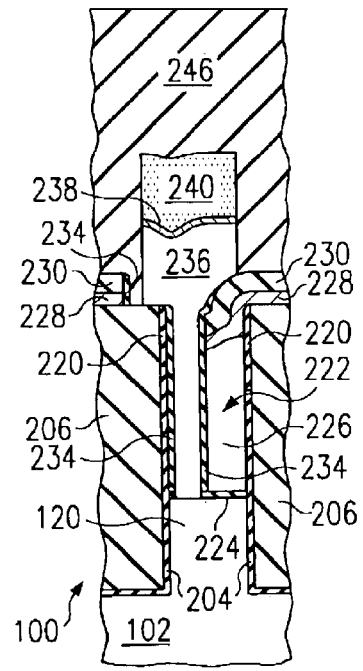
Figure 55A:
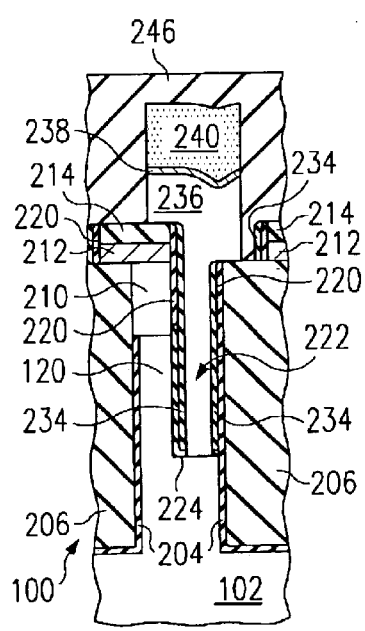
Figure 55B:
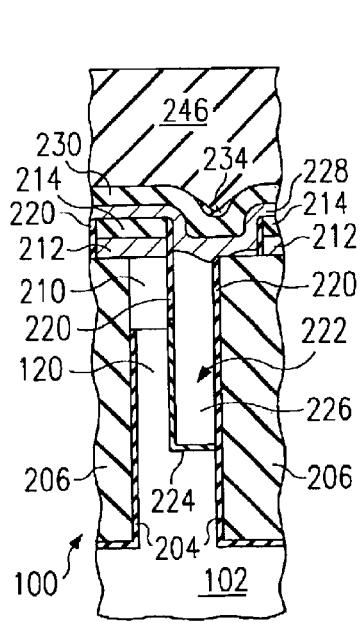
Figure 55C:
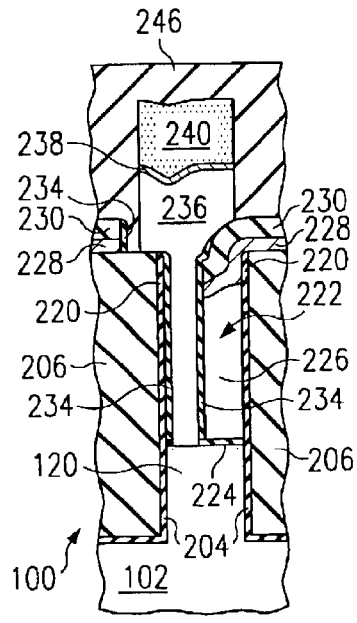

With reference to FIGS. 43A–43C, the silicon dioxide layer 224 can be etched in those locations where it is not covered by the additional polysilicon 226, or the additional SiN 234. Deposition of a third polysilicon portion 236 can then be carried out as shown in FIGS. 44A–44C. It will be appreciated that the third polysilicon layer can extend down to the hole floor 128 discussed above due to the previous etching of the SiO$_2$ layer 224. With reference to FIGS. 45A–45C and 46A–46C, a thin film of TiN 238, followed by a layer of platinum 240 can be deposited on the top of the structure present after the execution of the steps depicted through FIGS. 44A–44C. This can be followed by deposition of a layer of SiO$_2$ 242 and a fourth resist coat 244, as shown in FIGS. 47A–47C and 48A–48C.

As shown in FIGS. 49A–49C through 51A–51C, the fourth resist coat 244 can be patterned using a fourth mask to form the above-mentioned storage nodes 132. This can be followed by etching of the silicon dioxide layer 242 where it is not protected by the fourth resist coat 244, and then by removal of the resist coat 244.

As shown in FIGS. 52A–52C, the platinum layer 240 can be etched away in those regions where it is unprotected by the silicon dioxide layer 242, and the silicon dioxide layer 242 can then be removed. Further, the third polysilicon layer 236 can be etched away in those regions where it is unprotected by the remaining portions of the platinum layer 240. It will be appreciated that the remaining portions of the platinum layer 240 form the storage nodes 132 while the remaining portions of the third polysilicon layer 236 form the storage node plugs 134. Elements 132, 134 have been discussed above. Etching of the third polysilicon layer 236 is shown in FIGS. 53A–53C. Finally, attention should be given to FIGS. 54A–54C through 56A–56C which depict deposition of a final layer of silicon dioxide 246 which is subsequently polished and etched down to a level below the tops of the storage nodes formed by the remaining portions of the platinum layer 240. Where final silicon dioxide layer 246 touches silicon dioxide layer 214, layer 214 is no longer separately labeled. The same is true where final silicon dioxide layer 246 touches silicon dioxide layer 230.

The pillars of semiconductor material can be, for example, about 0.21 μm on a side. Other dimensions can be determined with reference to the several views of the drawings, which are proportional.

Figures 56A, 56B, 56C:
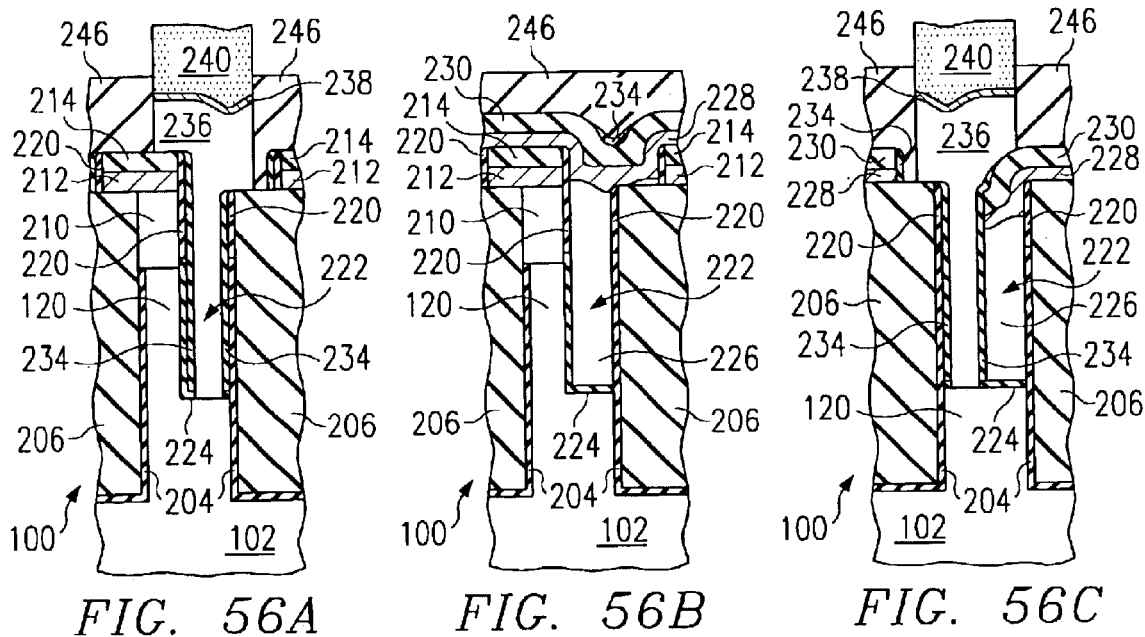

It is instructive to compare FIGS. 4A–4C with FIGS. 56A–56C. As discussed above, remaining portions of platinum layer 240 correspond to the storage nodes 132. Further, the remaining portions of the TiN thin film 238 correspond to the TiN layer 160. Remaining portions of the third polysilicon layer 236 correspond to the, storage node plug 134. The remaining portions of the polysilicon layer 210 correspond to the bit line plugs 142. The remaining portions of the polysilicon layer 226 correspond to the word line plug 146. The remaining SiN layers 220, 234 correspond respectively to the layers 138, 154. Remaining portions of the additional tungsten layer 228 correspond to the word lines 106, while the remaining portions of the tungsten layer 212 correspond to the bit lines 112. Silicon layer 206 corresponds to the trench isolation regions 122 and the final silicon layer 246 forms the additional insulation 158.

With reference again to FIGS. 4A–4C, the writing charging path is indicated by the heavy dashed line 300 in FIG. 4C. Charge from the bit line 112 goes through the bit line contact plug 142 and then to the bit line contact and source region 144. By turning on the transfer gate 148, an inversion layer is formed between the source region 144 and the drain region 136 (seen in FIG. 4C) at the bottom of the storage node plug 134 and the drain region 136. As shown by the dashed line 300, charge goes up through the storage node plug 134 and then into the storage node 132. The cell capacitance can be formed between the storage node 132 and a plate electrode separated by a suitable dielectric. Neither the plate electrode nor the dielectric are shown in the figures, as they can be formed in any desired fashion.

Although the present invention has been described in detail, it should be understood that various changes, substitutions and alterations can be made hereto without departing from the spirit and scope of the invention as defined by the appended claims.

What is claimed is:

1. A method for manufacturing a dynamic random access memory (DRAM) device, said method comprising the steps of:

providing a substrate of semiconductor material having a main outer surface; said main outer surface of said substrate, each of said pillars having a pillar outer surface, said pillars being formed using a first mask, said pillars being electrically isolated from each other and including an active region of said semiconductor material;

forming a plurality of substantially parallel bit lines located outwardly of said main outer surface of said substrate, each of said bit lines having a bit line width defined by first and second bit line edges and being separated from adjacent bit lines by a bit line separation distance, said bit lines being formed using a second mask;

forming a plurality of pillars of semiconductor material extending outward from interconnecting said bit lines with said pillar outer surfaces via a plurality of bit line plugs so as to form, at intersections of said bit line plugs with said pillar outer surfaces, a plurality of bit line contacts and one of sources and drains of a plurality of MOS transistors;

forming at least one hole region defined by a hole floor and at least one hole wall in each of said plurality of pillars, said hole floors being located outwardly of said main outer surface of said substrate;

forming a plurality of substantially parallel word lines located outwardly of said main outer surface of said substrate, each of said word lines having a word line width defined by first and second word line edges and being separated from adjacent word lines by a word line separation distance, said word lines being substantially perpendicular to said bit lines, said word lines being formed using a third mask, a given one of said first and second word line edges of a given one of said word lines and a given one of said first and second bit line edges of a given one of said bit lines intersecting substantially outward of a center of a given one of said active regions;

locating a word line plug in each of said hole regions, each of said word line plugs extending from a corresponding adjacent one of said word lines inwardly into said hole region and terminating outward of said hole floor, each of said word line plugs being electrically isolated from said semiconductor material of said pillar such that a portion of each of said word line plugs adjacent to and electrically isolated from said semiconductor material of said pillar forms a gate of said MOS transistor with a corresponding portion of said semiconductor material of said pillar forming a channel region of said MOS transistor;

forming a plurality of storage nodes, one for each of said active regions, each of said storage nodes being offset from its corresponding one of said active regions in a direction away from said given one of said word lines and said given one of said bit lines which intersect substantially outwardly of said center of said given one of said active regions, said storage nodes being formed using a fourth mask; and interconnecting said storage nodes with said hole floors of said pillars via a plurality of storage node plugs so as to form, at intersections of said storage node plugs with said hole floors, a plurality of storage node contacts and another of sources and drains of said plurality of MOS transistors, said storage node plugs extending through said hole regions in said pillars and being electrically isolated from said hole walls and said word line plugs.

2. The method of claim 1, further comprising the additional step of forming a plurality of trench isolators between said pillars to obtain said electrical isolation.

3. The method of claim 1, further comprising the additional step of forming a layer of gate $SiO_2$ between each of said gates and each of said corresponding portions of said semiconductor material of said pillars.

4. The method of claim 1, wherein:

step (c) comprises forming said bit lines such that said bit line width and said bit line separation distance are both substantially equal to a characteristic minimum feature size F;

step (f) comprises forming said word lines such that said word line width and said word line separation distance are also both substantially equal to said characteristic minimum feature size F;

whereby a planform area of each of a plurality of memory cells, formed one at each of said plurality of pillars, is substantially $4F^2$.

5. The method of claim 1, wherein step (h) comprises forming said storage nodes such that said direction in which each of said storage nodes is offset from its corresponding one of said active regions is substantially identical for all of said storage nodes.

6. The method of claim 1, wherein step (h) comprises the sub-steps of:

(h-1) forming those of said storage nodes which are associated with even-numbered bit lines with said direction in which each of said storage nodes is offset from its corresponding one of said active regions substantially identical to each other; and (h-2) forming those of said storage nodes which are associated with odd numbered bit lines with said direction in which each of said storage nodes is offset from its corresponding one of said active regions substantially identical to each other and opposite to said direction for those storage nodes associated with said even numbered bit lines in a direction substantially parallel to said bit lines.

7. The method of claim 1, wherein:

step (d) comprises forming said bit line plugs such that they have a bit line plug outline when viewed in plan view; and step (g) comprises forming said word line plugs such that they have a word line plug outline when viewed in plan view; and step (i) comprises forming said storage node plugs such that they have a storage node plug outline when viewed in plan view;

further comprising the additional step of shaping said bit line plugs, said word line plugs and said storage node plugs such that at least two of said word line plugs, said bit line plugs and said storage node plugs are not enclosed by any of said outlines of any other of said storage node plugs, said word line plugs and said bit line plugs.

8. The method of claim 7, wherein said shaping step comprises shaping said bit line plugs, said word line plugs and said storage node plugs such that all three of said bit line plugs, said word line plugs and said storage node plugs are not enclosed by any of said outlines of any other of said word line plugs, said bit line plugs and said storage node plugs.

9. The method of claim 8, wherein said shaping step comprises shaping said word line plugs, said bit line plugs and said storage node plugs such that all three of said plugs are solid when viewed in plan.

10. The method of claim 1, further comprising the additional step of shaping said storage node plugs, said bit line plugs and said word line plugs such that, for each of said pillars, associated ones of said storage node plugs, said bit line plugs and said word line plugs form a substantially asymmetric structure when viewed in plan.

11. The method of claim 10, wherein said shaping step comprises shaping said storage node plugs, said bit line plugs and said word line plugs such that each of said storage node plugs, said bit line plugs and said word line plugs has a substantially solid cross section when viewed in plan.

12. A method for manufacturing a dynamic random access memory (DRAM) device, said method comprising the steps of:

forming a word line over a semiconductor substrate;

forming a bit line over said substrate and cross said word line;

forming a memory cell in a pillar of semiconductor material in said substrate in proximity to said crossing of said bit line and said word line, said step of forming said memory cell including the steps of:

forming a pillar of semiconductor material extending from a main surface of said substrate, said pillar comprising an active region extending along at least a portion of the length of said pillar and serving as a channel for a transistor, said active region having a top end and a bottom end;

coupling a word line plug of semiconductor material to said word line, said word line plug adjacent to and insulated from said pillar and said active region in said pillar, said first plug serving as a gate for said transistor;

coupling a bit line plug of semiconductor material to said bit line, said bit line plug in contact with a top surface of said pillar adjacent said top end of said active region, said bit line plug forming either a source or a drain of said transistor; and coupling a storage node plug of semiconductor material to a capacitor, said storage node plug in contact with said pillar adjacent said bottom end of said doped region, said storage node plug forming either a drain or a source of said transistor.

13. The method of claim 12, comprising the steps of forming a plurality of said memory cells in a plurality of pillars of semiconductor material, and isolating said pillars from adjacent pillars by trench isolation.

14. The method of claim 12, comprising the steps of forming a plurality of said memory cells in a plurality of pillars of semiconductor material, and offsetting said third plug in each cell from said active region in a particular direction.

15. The method of claim 12, comprising the steps of forming a plurality of said memory cells in a plurality of pillars of semiconductor material, associating said memory cells with crossings of said word lines and said bit lines, offsetting said third plug in memory cells associated with crossings of a particular bit line in a first direction, and offsetting said third plug in memory cells associated with crossings of bit lines adjacent to said particular bit line in a second direction.

16. A method for manufacturing a dynamic random access memory (DRAM) device, comprising the steps of:

providing a semiconductor substrate having a planar surface;

forming a word line over said planar surface of a said semiconductor substrate;

forming a bit line over said planar surface of said substrate and crossing said word line;

forming a memory cell having a transistor substantially within an area formed by the crossing of said word line and said bit line, said memory cell formed within said crossing area such that a channel of a said transistor in said cell is disposed substantially perpendicular to said planar surface of said substrate.

17. The method of claim 16, comprising the steps of forming a plurality of said memory cells, each of which cells has a channel of a transistor formed in a semiconductor pillar perpendicular to said planar surface of said substrate, and isolating each of said pillars from adjacent pillars by trench isolation.

18. The method of claim 16, comprising the steps of forming a plurality of said memory cells, each of which cells having a channel of a transistor formed in a semiconductor pillar perpendicular to said planar surface of said substrate, each of said cells further comprising a storage node plug adjacent said pillar, and offsetting said storage node plug from said channel of said transistor.

19. The method of claim 16, comprising the steps of forming a plurality of said word lines and said bit lines, associating said memory cells with crossings of said word lines and said bit lines, forming a channel of a transistor in a semiconductor pillar perpendicular to said planar surface of said substrate, forming a storage node plug adjacent said pillar wherein said storage node plug in each cell associated with crossings of a particular bit line are offset, and said storage node plug in each cell associated with crossings of bit lines adjacent to said particular bit line are offset in a direction different from said offset of said storage node plug in each cell.

* * * * *